United States Patent
Chikama et al.

(10) Patent No.: US 8,685,803 B2
(45) Date of Patent: Apr. 1, 2014

(54) SEMICONDUCTOR DEVICE AND METHOD FOR PRODUCING SAME

(75) Inventors: Yoshimasa Chikama, Osaka (JP); Hirohiko Nishiki, Osaka (JP); Yoshifumi Ohta, Osaka (JP); Yuuji Mizuno, Osaka (JP); Hinae Mizuno, legal representative, Yamato (JP); Takeshi Hara, Osaka (JP); Tetsuya Aita, Osaka (JP); Masahiko Suzuki, Osaka (JP); Michiko Takei, Osaka (JP); Okifumi Nakagawa, Osaka (JP); Yoshiyuki Harumoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/514,081

(22) PCT Filed: Dec. 3, 2010

(86) PCT No.: PCT/JP2010/071728
§ 371 (c)(1),
(2), (4) Date: Jun. 6, 2012

(87) PCT Pub. No.: WO2011/070981
PCT Pub. Date: Jun. 16, 2011

(65) Prior Publication Data
US 2012/0241750 A1    Sep. 27, 2012

(30) Foreign Application Priority Data
Dec. 9, 2009    (JP) .................... 2009-279826

(51) Int. Cl.
*H01L 21/00*    (2006.01)

(52) U.S. Cl.
USPC ....... 438/149; 257/72; 257/258; 257/E31.053

(58) Field of Classification Search
USPC ........ 257/71, E29.273, 59, 72, 258, E31.053; 438/149, 151
See application file for complete search history.

(56) References Cited

U.S. PATENT DOCUMENTS

| 7,297,977 B2 | 11/2007 | Hoffman et al. |
| 7,382,421 B2 | 6/2008 | Hoffman et al. |

(Continued)

FOREIGN PATENT DOCUMENTS

| JP | 2003-179069 A | 6/2003 |
| JP | 2007-123861 A | 5/2007 |

(Continued)

OTHER PUBLICATIONS

English translation of Official Communication issued in corresponding International Application PCT/JP2010/071728, mailed on Jul. 19, 2012.
Official Communication issued in International Patent Application No. PCT/JP2010/071728, mailed on Jan. 11, 2011.

*Primary Examiner* — Jarrett Stark
*Assistant Examiner* — Shahed Ahmed
(74) *Attorney, Agent, or Firm* — Keating & Bennett, LLP

(57) ABSTRACT

A semiconductor device includes: a thin film transistor having a gate line (3a), a first insulating film (5), an island-shaped oxide semiconductor layer (7a), a second insulating film (9), a source line (13as), a drain electrode (13ad), and a passivation film; and a terminal portion having a first connecting portion (3c) made of the same conductive film as the gate line, a second connecting portion (13c) made of the same conductive film as the source line and the drain electrode, and a third connecting portion (19c) formed on the second connecting portion. The second connecting portion is in contact with the first connecting portion within a first opening (11c) provided in the first and second insulating films; the third connecting portion (19c) is in contact with the second connecting portion within a second opening (17c) provided in the passivation film; and the second connecting portion (13c) covers end faces of the first and second insulating films within the first opening (11c), but does not cover an end face of the passivation film (15) within the second opening (17c). As a result, the taper shape of a contact hole of the terminal portion can be controlled with a high precision.

3 Claims, 11 Drawing Sheets

(56) References Cited

U.S. PATENT DOCUMENTS

| | | | |
|---|---|---|---|
| 7,791,072 | B2 | 9/2010 | Kumomi et al. |
| 7,868,326 | B2 | 1/2011 | Sano et al. |
| 8,188,477 | B2 * | 5/2012 | Miyairi et al. ............ 257/59 |
| 2005/0039670 | A1 | 2/2005 | Hosono et al. |
| 2007/0072439 | A1 | 3/2007 | Akimoto et al. |
| 2008/0119018 | A1 | 5/2008 | Toyota et al. |
| 2009/0001374 | A1 | 1/2009 | Inoue et al. |
| 2009/0146150 | A1 | 6/2009 | Hosoya |
| 2009/0267173 | A1 | 10/2009 | Takahashi et al. |
| 2011/0084280 | A1 | 4/2011 | Nakayama et al. |

FOREIGN PATENT DOCUMENTS

| | | |
|---|---|---|
| JP | 2007-235102 A | 9/2007 |
| JP | 2007-258675 A | 10/2007 |
| JP | 2008-129314 A | 6/2008 |
| JP | 2008-170664 A | 7/2008 |
| JP | 4164562 B2 | 10/2008 |
| JP | 2008-311342 A | 12/2008 |
| JP | 2009-075385 A | 4/2009 |
| JP | 2009-157354 A | 7/2009 |
| JP | 2009-260323 A | 11/2009 |
| WO | 2009/128424 A1 | 10/2009 |

* cited by examiner (a)

(b)

(c)    (d)

(a)

(b)

(c)    (d)

(a)

(b)

SEMICONDUCTOR DEVICE AND METHOD FOR PRODUCING SAME

TECHNICAL FIELD

The present invention relates to a semiconductor device having a thin film transistor and a method for producing the same.

BACKGROUND ART

Generally speaking, a liquid crystal display device or an organic EL display device of an active matrix type includes: a substrate on which a thin film transistor (Thin Film Transistor; hereinafter "TFT") is formed as a switching element for each pixel (hereinafter a "TFT substrate"); a counter substrate on which a counter electrode, color filters, and the like are formed; and an optical modulation layer, e.g., a liquid crystal layer, provided between the TFT substrate and the counter substrate.

On the TFT substrate, a plurality of source lines, a plurality of gate lines, and a plurality of TFTs respectively disposed at intersections therebetween, pixel electrodes for applying a voltage across the optical modulation layer such as a liquid crystal layer, storage capacitor lines and storage capacitor electrodes, and the like are formed. Moreover, at an end portion of the TFT substrate, terminal portions for allowing the source lines and gate lines to be respectively connected to input terminals of a driving circuit are provided. The driving circuit may be formed on the TFT substrate, or on a separate substrate (circuit board).

The construction of a TFT substrate is disclosed in Patent Document 1, for example. Hereinafter, with reference to the drawings, the construction of a TFT substrate disclosed in Patent Document 1 will be described.

FIG. 12(a) is a schematic plan view showing the TFT substrate in outline, and the FIG. 12(b) is an enlarged plan view showing one pixel of the TFT substrate. FIG. 13 is a cross-sectional view of a TFT and terminal portions of the semiconductor device shown in FIG. 12.

As shown in FIG. 12(a), the TFT substrate includes a plurality of gate lines 2016 and a plurality of source lines 2017. Each region 2021 surrounded by these lines 2016 and 2017 defines a "pixel". In a region 2040 of the TFT substrate other than the region (displaying region) where the pixels are formed, a plurality of connecting portions 2041 for allowing the plurality of gate lines 2016 and source lines 2017 to be respectively connected to a driving circuit are provided. Each connecting portion 2041 constitutes a terminal portion for providing connection to external wiring. In the present specification, the region 2040 of the TFT substrate in which a plurality of terminal portions are provided is referred to as a "terminal deployment region". As shown in FIG. 12(b) and FIG. 13, a pixel electrode 2020 is provided so as to cover each region 2021 defining a pixel. Moreover, a TFT is formed in each region 2021. The TFT includes a gate electrode G, gate insulating films 2025 and 2026 covering the gate electrode G, a semiconductor layer 2019 disposed on the gate insulating film 2026, and a source electrode S and a drain electrode D respectively connected to both end portions of the semiconductor layer 2019. The TFT is covered by a passivation film 2028. An interlayer insulating film 2029 is formed between the passivation film 2028 and the pixel electrode 2020. The source electrode S of the TFT is connected to a source line 2017, whereas the gate electrode G is connected to a gate line 2016. The drain electrode D is connected to the pixel electrode 2020 within a contact hole 2030.

Moreover, a storage capacitor line 2018 is formed in parallel to the gate line 2016. The storage capacitor line 2018 is connected to a storage capacitor. Herein, the storage capacitor is composed of a storage capacitor electrode 2018b which is made of the same conductive film as the drain electrode, a storage capacitor electrode 2018a which is made of the same conductive film as the gate line, and the gate insulating film 2026 interposed therebetween. On the connecting portion 2041 extending from each gate line 2016 or source line 2017, the gate insulating films 2025 and 2026 and the passivation film 2028 are not formed, but a connection line 2044 is formed so as to be in contact with an upper face of the connecting portion 2041. As a result, electrical connection between the connecting portion 2041 and the connection line 2044 is ensured.

As shown in FIG. 13, in the liquid crystal display device, the TFT substrate 2013 is disposed so as to oppose a substrate 2014 on which a counter electrode and color filters are formed, with a liquid crystal layer 2015 interposed therebetween.

When fabricating such a TFT substrate, the regions 2021 to become pixels (also referred to as "pixel portions") and the terminal portions are preferably formed through a common process, so as to reduce increase in the number of masks and the number of steps.

In order to fabricate the aforementioned TFT substrate, it is necessary to etch away the portions of the gate insulating films 2025 and 2026 and the passivation film 2028 that are located in the terminal deployment region 2040, and the portions of the gate insulating film 2025 and the passivation film 2028 that are located in the regions where the storage capacitors are to be formed. Patent Document 1 discloses forming an interlayer insulating film 2029 by using an organic insulating film, and by using this as a mask, etching the insulating films 2025 and 2026 and the passivation film 2028.

On the other hand, it has been proposed in the recent years to form an active layer of a TFT by using an oxide semiconductor film such as zinc oxide, instead of a silicon semiconductor film. Such a TFT is referred to as an "oxide semiconductor TFT". An oxide semiconductor has higher mobility than does amorphous silicon. Therefore, an oxide semiconductor TFT is able to operate more rapidly than an amorphous silicon TFT. Moreover, an oxide semiconductor film is formed through simpler processes than those of a polycrystalline silicon film, and therefore is also applicable to devices which require a large area.

However, during the production process of an oxide semiconductor TFT having a bottom-gate structure, carrier electrons may occur due to oxygen defects in a heat treatment step or the like, for example, thus resulting in lower resistance. There is also a problem in that the underlying oxide semiconductor film is susceptible to damage in the steps of etching source/drain electrodes and the step of forming an interlayer insulating film.

On the other hand, a structure (channel-protection type) has been proposed in which a channel protection film is provided so as to cover the region of a semiconductor layer where a channel is to be formed (channel-forming region). In a TFT production process, when forming source/drain electrodes after a channel protection film is formed on the semiconductor layer, the channel protection film functions as an etchstop in performing an etching for forming the source/drain electrodes. As a result, the damage which the channel-forming region receives through etching can be reduced.

Patent Document 2 describes the construction of a pixel portion of a TFT substrate having channel-protection type TFTs. However, the TFTs of Patent Document 2 are formed by using a silicon film.

FIG. 14 is a cross-sectional view showing a portion of the TFT substrate described in Patent Document 2. In each pixel of the TFT substrate, a thin film transistor 1141 and a storage capacitor 1142 are provided. In the thin film transistor 1141, a gate line 1102, a gate insulating film 1104, a semiconductor layer 1113 having a channel-forming region, a channel protection film 1108, a source region 1118, a drain region 1117, and a drain electrode 1121 and a source line 1122 are formed. The thin film transistor 1141 is covered by a passivation film 1127, and a pixel electrode 1131 is provided on the passivation film 1127. Within a contact hole which is formed in the passivation film 1127, the pixel electrode 1131 is connected to the drain electrode 1121. The storage capacitor 1142 is composed of the gate insulating film 1104 and the passivation film 1127 interposed between the electrodes as the dielectric, with the electrodes being a capacitor line 1151 which is formed of the same conductive film as the gate line 1102 and the pixel electrode 1131.

In the present specification, an insulating film which is formed between a channel-forming region and a source/drain electrode of a semiconductor layer is referred to as a "channel protection film" or an "etch stopper", whereas any insulating film covering a TFT, or an insulating film which is formed on source/drain electrodes in the case of a bottom-gate structure, is simply referred to a "passivation film" for distinction between them.

Although not shown, in a terminal portion of this TFT substrate, the gate line 1102 can be electrically connected to external wiring which is provided on the passivation film 1127, within a contact hole which is formed in the passivation film 1127 and the gate insulating film 1104 over the gate line 1102.

In the aforementioned method for producing a semiconductor device, an etching for forming the channel protection film 1108, an etching for forming the source/drain electrodes 1121 and 1122, and an etching for forming a contact hole in the passivation film 1127 are performed (FIG. 7 to FIG. 9 of Patent Document 2). It is considered that the contact hole in the terminal portion is formed by allowing the passivation film 1127 and the gate insulating film 1104 to be etched at one time when etching the passivation film 1127.

In Patent Document 3, use of halftone masks is proposed in the method of producing the TFT substrate having channel-protection type TFTs, this being in order to reduce the number of masks to be used. However, the method of Patent Document 3 involves a complicated production process, and may lower the mass producibility. Moreover, because only one layer of insulating film is formed between the gate electrode and the source/drain electrodes, there is a possibility that short-circuiting may occur between these electrodes.

CITATION LIST

Patent Literature

[Patent Document 1] Japanese Laid-Open Patent Publication No. 2008-170664
[Patent Document 2] Japanese Laid-Open Patent Publication No. 2009-157354
[Patent Document 3] Japanese Laid-Open Patent Publication No. 2007-258675

SUMMARY OF INVENTION

Technical Problem

In the methods disclosed in Patent Documents 1 and 2, in a terminal portion of the TFT substrate, a gate insulating film and a passivation film must be simultaneously etched. It has been found through a study of the inventors that applying such methods to a TFT substrate having oxide semiconductor TFTs will result in the following problems. Generally speaking, in an oxide semiconductor TFT, an oxide film such as an $SiO_2$ film is often used as a gate insulating film or a passivation film. This is because, when oxygen defects occur in the oxide semiconductor layer, the oxygen defects can be remedied with the oxygen contained in the oxide film.

According to Patent Document 1, when fabricating the TFT substrate (FIG. 12, FIG. 13), the interlayer insulating film 2029 is formed by using an organic insulating film, and with this as a mask, a portion of the gate insulating films 2025 and 2026 and the passivation film 2028 that is located in the terminal deployment region 2040 is etched away, whereby a contact hole in a terminal portion is formed. If $SiO_2$ is used as the material of either the gate insulating films 2025 and 2026 or the passivation film 2028, a long etching time will be required because $SiO_2$ has a very low etch rate. As a result, the organic insulating film (interlayer insulating film) 2029 serving as a mask may be damaged.

In Patent Document 2, a contact hole in a terminal portion is presumably formed by, with a resist mask, allowing the passivation film 1127 and the gate insulating film 1104 to be etched at one time. In this case, if $SiO_2$ is used as the material of either the passivation film 1127 or the gate insulating film 1104, the very low etch rate of $SiO_2$ may lead to a possibility that the resist mask may be damaged in the etching step, thus hindering removal of the resist mask. Moreover, a low etch rate makes it difficult to form a desired taper shape on the wall surface of a contact hole in a terminal portion, such that the wall surface may become substantially perpendicular to the substrate. In such cases, a problem also arises in that any line formed in the contact hole of the terminal portion becomes likely to be disrupted. Thus, conventionally, in the etching step for forming a source terminal or a gate terminal, the etching mask may be damaged, or line disruptions may occur due to the taper shape of the contact hole not being optimized, thus possibly lowering the reliability of the TFT substrate.

The present invention has been made in view of the above circumstances, and a main objective thereof is to, when forming a contact hole in a terminal portion of a semiconductor device having an oxide semiconductor TFT and the terminal portion for allowing electrodes of the TFT to be connected to external wiring, reduce mask damage and control the taper shape of a wall surface of the contact hole with a high precision.

Solution to Problem

A semiconductor device according to the present invention is a semiconductor device comprising: a substrate; a thin film transistor formed on the substrate; and a terminal portion for electrically connecting the thin film transistor to external wiring, the thin film transistor including: a gate line provided on the substrate; a first insulating film formed on the gate line; an island-shaped oxide semiconductor layer formed on the first insulating film, the island-shaped oxide semiconductor layer having a channel region and having a source region and a drain region located at opposite sides of the channel region; a second insulating film provided in contact with the oxide semiconductor layer; a source line provided on the second insulating film and electrically connected to the source region; a drain electrode provided on the second insulating film and electrically connected to the drain region; and a passivation film being provided on the source line and the drain electrode and covering the thin film transistor, the terminal portion including: a first connecting portion made of a same conductive film as the gate line; a second connecting portion formed on the first connecting portion and made of a same conductive film as the source line and the drain electrode; and a third connecting portion formed on the second connecting portion, wherein, within a first opening provided in the first insulating film and the second insulating film, the second connecting portion is in contact with the first connecting portion; within a second opening provided in the passivation film, the third connecting portion is in contact with the second connecting portion; and the second connecting portion covers end faces of the first insulating film and the second insulating film within the first opening, but does not cover an end face of the passivation film within the second opening.

In a preferred embodiment, the second opening is located inside the first opening as viewed from a normal direction of a surface of the substrate.

A pixel electrode electrically connected to the drain electrode may be further comprised, and the third connecting portion may be made of a same conductive film as the pixel electrode.

A preferred embodiment further comprises a storage capacitor formed on the substrate, the storage capacitor including: a storage capacitor line made of a same conductive film as the gate line; the first insulating film covering the storage capacitor line; a semiconductor layer for forming the storage capacitor, the semiconductor layer being made of a same oxide semiconductor film as the oxide semiconductor layer; and a storage capacitor electrode provided on the semiconductor layer for forming the storage capacitor, wherein the storage capacitor electrode is in contact with the semiconductor layer for forming the storage capacitor within an opening formed in the second insulating film.

In a preferred embodiment, the storage capacitor electrode is a portion of the drain electrode; and the pixel electrode is in contact with the storage capacitor electrode within an opening formed in the passivation film.

In a preferred embodiment, the storage capacitor electrode is a portion of the pixel electrode.

A gate-source connecting portion for electrically connecting the gate line and the source line may be further comprised, and, in the gate-source connecting portion, the source line may be in contact with the gate line within the first opening provided in the first insulating film and the second insulating film.

An organic insulating film may be further comprised between the passivation film and the pixel electrode.

Preferably, at least one of the first insulating film and the passivation film contains $SiO_2$.

The first insulating film may have a multilayer structure including an $SiO_2$ film and an $SiN_x$ film, the $SiO_2$ film being an uppermost layer of the multilayer structure and being in contact with a lower face of the oxide semiconductor layer.

The passivation film may have a multilayer structure including an $SiO_2$ film and an $SiN_x$ film, the $SiO_2$ film being a lowermost layer of the multilayer structure.

In a preferred embodiment, at least the first insulating film and the oxide semiconductor layer are provided between an upper face and side wall of the gate line and the source line, and between the upper face and side wall of the gate line and the drain electrode.

The second insulating film may be further provided between the upper face and side wall of the gate line and the source line, and between the upper face and side wall of the gate line and the drain electrode.

Within a surface of the oxide semiconductor layer, the second insulating film may cover an entirety of an upper face and side wall except the source region and the drain region, and may be in contact with an upper face of the first insulating film in a neighborhood of a side wall of the oxide semiconductor layer.

A width of the oxide semiconductor layer along a channel length direction may be greater than a width of the gate line along the channel length direction.

A method for producing a semiconductor device according to the present invention is a method for producing any of the above semiconductor devices, comprising: (A) a step of forming a conductive film for a gate line on a substrate, and patterning the conductive film to form a gate line and a first connecting portion; (B) a step of forming a first insulating film on the gate line and the first connecting portion; (C) a step of forming on the first insulating film an oxide semiconductor layer to become an active layer of a thin film transistor; (D) a step of forming a second insulating film covering the oxide semiconductor layer and the first insulating film; (E) a step of etching the first and second insulating films, by using the oxide semiconductor layer as an etchstop, to form in the second insulating film an opening for forming a source contact and an opening for forming a drain contact, such that the oxide semiconductor layer is exposed through the openings, and form a first opening in the second insulating film and the first insulating film, such that a surface of the first connecting portion is exposed through the first opening; (F) a step of forming a conductive film for source/drain electrodes on the second insulating film, and patterning the conductive film to form a source line which is in contact with the oxide semiconductor layer within the opening for forming a source contact, a drain electrode which is in contact with the oxide semiconductor layer within the opening for forming a drain contact, and a second connecting portion which is in contact with the first connecting portion within the first opening; (G) a step of forming a passivation film on the source line, the drain electrode, and the second connecting portion; (H) a step of forming a second opening in the passivation film, such that the second connecting portion is exposed through the second opening; and (I) a step of forming a third connecting portion on the passivation film, the third connecting portion being in contact with the second connecting portion within the second opening.

Step (H) may comprise a step of forming in the passivation film an opening for exposing the drain electrode; and step (I) may be a step of forming a transparent conductive film on the passivation film, and patterning the transparent conductive film to form the third connecting portion and a pixel electrode, the pixel electrode being in contact with the drain electrode within the opening for exposing the drain electrode.

Advantageous Effects of Invention

According to the present invention, when forming a contact hole in a terminal portion of a semiconductor device having an oxide semiconductor TFT and the terminal portion for allowing electrodes of the TFT to be connected to external wiring, mask damage can be reduced by decreasing the etching time, and the taper shape of the wall surface of the contact hole can be controlled with a high precision. As a result, the reliability of the semiconductor device can be enhanced.

Moreover, the aforementioned semiconductor device can be produced in a simple manner without complicating the production steps.

DESCRIPTION OF EMBODIMENTS

Embodiment 1

Figure 1:
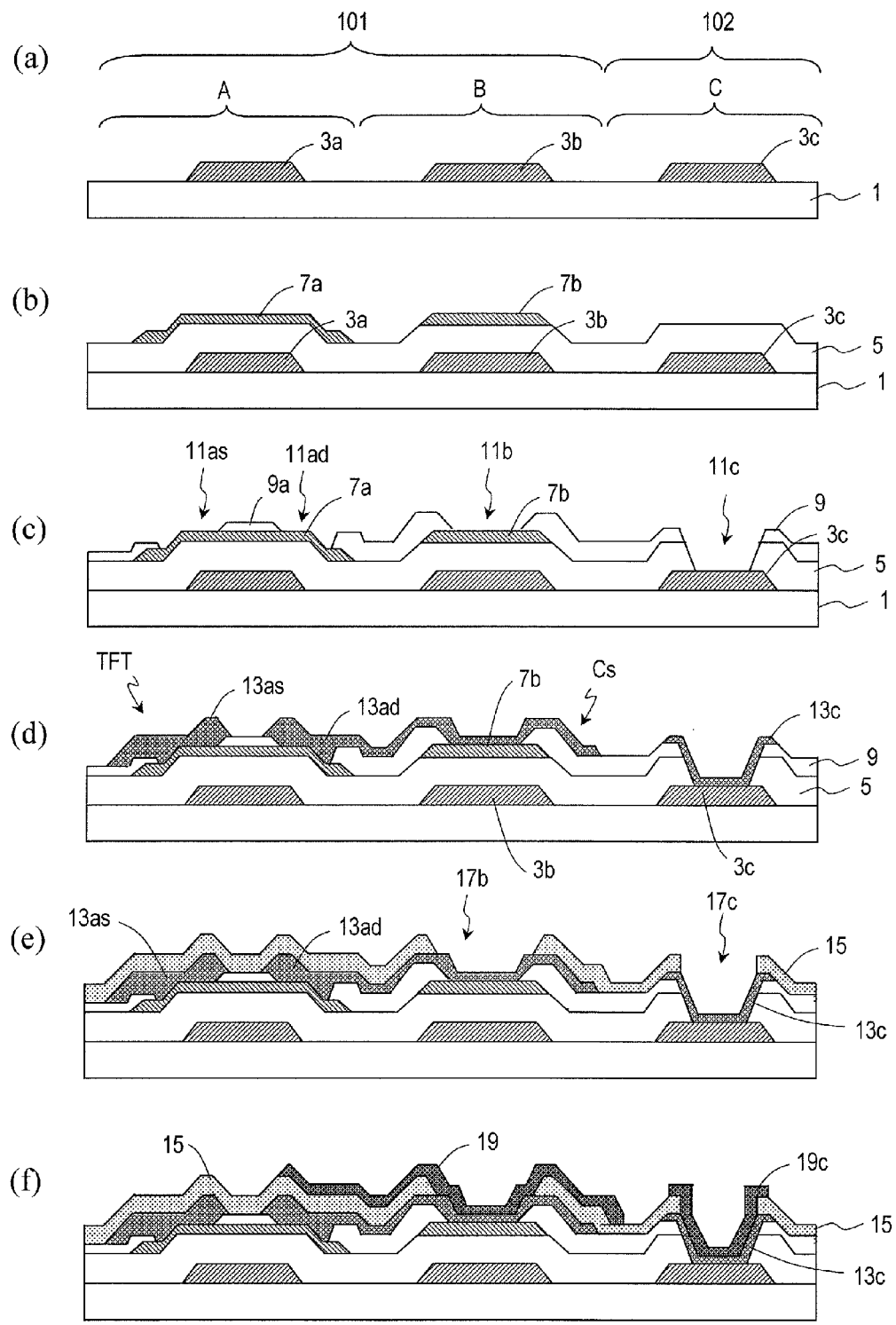
FIG. 1 (a) to (f) are step-by-step cross-sectional views showing an exemplary method for producing a semiconductor device according to Embodiment 1 of the present invention.

Hereinafter, with reference to the drawings, a method for producing a semiconductor device according to Embodiment 1 of the present invention will be described.

The semiconductor device of the present embodiment may include any TFT substrate on which at least one oxide semiconductor TFT is formed, and broadly encompasses various display devices, TFT substrates, electronic devices, and the like.

Herein, a method for producing a TFT substrate of a liquid crystal display device which includes oxide semiconductor TFTs as switching elements will be illustrated as an example. The TFT substrate has a displaying region including a plurality of pixel portions and a terminal deployment region which is formed in a region other than the displaying region. In the present embodiment, an oxide semiconductor TFT and a storage capacitor is formed in each pixel portion of the displaying region, and a plurality of terminal portions are formed in the terminal deployment region.

FIGS. 1(a) to (f) are schematic step-by-step cross-sectional views for describing a method for producing the semiconductor device of the present embodiment.

First, as shown in FIG. 1(a), a gate line 3a is formed in a region (TFT-forming region) A of a substrate 1 where a TFT is to be formed; a storage capacitor line 3b is formed in a region (storage capacitor-forming region) B where a storage capacitor is to be formed; and a connecting portion 3c of a gate line is formed in a region (terminal portion-forming region) C where a gate/source terminal portion is to be formed.

Note that the TFT-forming region A and the storage capacitor-forming region B are located in each pixel portion 101 that is within the displaying region, whereas the terminal portion-forming region C is located in a region other than the displaying region, e.g., a terminal deployment region 102 which is located in the perimeter of the substrate 1. Usually, a multitude of source terminal portions and gate terminal portions are to be formed in the terminal deployment region 102; however, only a forming region C for one gate or source terminal portion is shown herein.

The gate line 3a, the storage capacitor line 3b, and the connecting portion 3c are formed by forming a metal film (e.g., Ti/Al/Ti film) on the substrate 1 by a sputtering technique or the like, and thereafter patterning the metal film. The patterning of the metal film is performed by forming a resist mask by known photolithography and removing the portion that is not covered by the resist mask. Thereafter, the resist mask is removed from the substrate 1.

Next, as shown in FIG. 1(b), an insulating film 5 is formed so as to cover the gate line 3a, the storage capacitor line 3b, and the connecting portion 3c. Then, an island-shaped oxide semiconductor layer 7a to become a channel layer of the TFT is formed in the TFT-forming region A, and an island-shaped oxide semiconductor layer 7b is formed in the storage capacitor-forming region B.

In the present embodiment, as the insulating film 5, a $SiO_2$ film having a thickness of about 400 nm, for example, is formed by using a CVD technique. Note that the insulating film 5 may be a single layer of $SiO_2$ film, for example, or have a multilayer structure having a lower layer of SiNx film and an upper layer of $SiO_2$ film. In the case of a single layer of $SiO_2$ film, the thickness of the $SiO_2$ film is preferably no less than 300 nm and no more than 500 nm. In the case where it has a multilayer structure composed of a SiNx film (lower layer) and an $SiO_2$ film (upper layer), the thickness of the SiNx film is preferably no less than 200 nm and no more than 500 nm, and the thickness of the $SiO_2$ film is preferably no less than 20 nm and no more than 150 nm.

The oxide semiconductor layer 7a, 7b can be formed as follows. First, by using a sputtering technique, an In—Ga—Zn—O type semiconductor (IGZO) film having a thickness of no less than 30 nm and no more than 300 nm, for example, is formed on the insulating film 5. Thereafter, by photolithography, a resist mask covering predetermined regions of the IGZO film is formed. Next, portions of the IGZO film that are not covered by the resist mask are removed by wet etching. Thereafter, the resist mask is removed. In this manner, the island-shaped oxide semiconductor layer 7a, 7b is obtained. Note that, the oxide semiconductor layer 7a, 7b may be formed by using any oxide semiconductor film other than an IGZO film.

Next, as shown in FIG. 1(c), an insulating film 9 is deposited over the entire surface of the substrate 1, and thereafter the insulating film 9 is patterned.

Specifically, first, an $SiO_2$ film (thickness: e.g. about 150 nm), for example, is formed as the insulating film 9 on the insulating film 5 and the oxide semiconductor layer 7a, 7b, by using a CVD technique.

The insulating film 9 preferably includes an oxide film such as SiOy. Using an oxide film makes it possible, when oxygen defects occur in the oxide semiconductor layer 7a, 7b, to remedy the oxygen defects with the oxygen contained in the oxide film, whereby the oxidation defects in the oxide semiconductor layer 7a, 7b can be decreased more effectively. Although a single layer of $SiO_2$ film is used as the insulating film 9 herein, the insulating film 9 may have a multilayer structure with a lower layer of $SiO_2$ film and an upper layer of SiNx film. The thickness (or the total thickness of the respective layers in the case of a multilayer structure) of the insulating film 9 is preferably no less than 50 nm and no more than 200 nm. When it is 50 nm or more, the surface of the oxide semiconductor layer 7a can be protected with greater certainty at patterning steps of the source/drain electrodes and the like. On the other hand, if it exceeds 200 nm, larger level differences occurring in the source electrode and the drain electrode may cause line breaking or the like.

Thereafter, by photolithography, a resist mask covering predetermined regions of the insulating film 9 is formed. Next, the portions of the insulating film 9 that are not covered by the resist mask are removed by wet etching.

At this time, etching conditions are to be selected such that not only the insulating film 9 but also the underlying insulating film 5 is etched in the terminal portion-forming region C, and that the oxide semiconductor layer 7a, 7b under the insulating film 9 is not etched in the TFT-forming region A and the storage capacitor-forming region B. Herein, $CF_4/O_2$ (flow rate: 475 sccm/25 sccm) is used as the etching gas, and dry etching is conducted in a chamber by setting the temperature of the substrate 1 at 60° C. The degree of vacuum within the chamber is 15 mT. The applied power is 1000 W, and the etching time is 7 minutes.

As a result of this, in the TFT-forming region A, portions of the insulating film 9 where a source contact and a drain contact are to be formed are etched, whereby two openings 11as and 11ad through which the oxide semiconductor layer 7a is exposed are formed. The insulating film 9 covers the region of the oxide semiconductor layer 7a to become a channel, and functions as a channel protection film 9a. In the storage capacitor-forming region B, the portion of the insulating film 9 that is located above the oxide semiconductor layer 7b is etched away, whereby an opening 11b exposing the oxide semiconductor layer 7b is formed. In the terminal portion-forming region C, the portion of the insulating film 9 that is located above the connecting portion 3c and the underlying insulating film 5 are consecutively etched away, whereby an opening 11c exposing the surface of the connecting portion 3c is obtained. The diameter of the opening 11c is 20 μm, for example.

In this step, etching conditions are preferably selected in accordance with the material of the insulating films 5 and 9, etc., such that the insulating film 5 and the insulating film 9 are etched with the oxide semiconductor layer 7a, 7b serving as an etchstop. As a result, in the terminal portion-forming region C, the insulating film 9 and the insulating film 5 are etched at one time (GI/ES simultaneous etching), whereas only the insulating film 9 is etched in the TFT-forming region A and the storage capacitor-forming region B. As used herein, etching conditions include, in the case of employing dry etching, the type of etching gas, the temperature of the substrate 1, the degree of vacuum within the chamber, and so on. In the case of employing wet etching, the type of etchant, the etching time, and so on are included.

Next, as shown in FIG. 1(d), a conductive film is formed on the entire surface of the substrate 1. In the present embodiment, a metal film, e.g., a Ti/Al/Ti film, is formed by a sputtering technique, for example. Thereafter, the metal film is patterned by photolithography, for example.

As a result, in the TFT-forming region A, on the inside of the openings 11as and 11ad and on the insulating film 9, a source line 13as and a drain electrode 13ad are formed so as to be respectively in contact with regions located at opposite sides of the region of the oxide semiconductor layer 7a to become a channel region. The drain electrode 13ad extends to above the storage capacitor line 3b in the storage capacitor-forming region B, and is in contact with the oxide semiconductor layer 7b through the opening 11b. The portion of the drain electrode 13ad that is in contact with the oxide semiconductor layer 7b also functions as a storage capacitor electrode. Moreover, in the terminal portion-forming region C, a connecting portion 13c which is electrically connected to the connecting portion 3c is formed on the inside of the opening 11c and on the insulating film 9.

In the present specification, the region of the oxide semiconductor layer 7a that is in contact with the source line 13as is referred to as a "source region", whereas the region that is in contact with the drain electrode 13ad is referred to as a "drain region". Moreover, the region of the oxide semiconductor layer 7a that is located on the gate line 3a and is interposed between the source region and the drain region is referred to as a "channel region".

In this manner, an oxide semiconductor TFT is formed in the TFT-forming region A, and a storage capacitor Cs is formed in the storage capacitor-forming region B. Note that the oxide semiconductor layer 7b is highly likely to become a conductor due to dry damage. In that case, the storage capacitor Cs will be constituted by the storage capacitor line 3b and the drain electrode 13ad and oxide semiconductor layer 7b as electrodes, and the insulating film 5 as dielectric.

Thereafter, as shown in FIG. 1(e), a passivation film 15 is deposited over the entire surface of the substrate 1, so as to cover the oxide semiconductor TFT and the storage capacitor Cs. In the present embodiment, as the passivation film 15, an oxide film such as an $SiO_2$ film (thickness: e.g. about 265 nm) is formed by a CVD technique. Note that the passivation film 15 may be a single layer of $SiO_2$ film, for example, or have a multilayer structure with a lower layer of $SiO_2$ film and an upper layer of SiNx film. In the case of a single layer of $SiO_2$ film, the thickness of the $SiO_2$ film is preferably no less than 50 nm and no more than 300 nm. In the case of a multilayer structure of an $SiO_2$ film (lower layer) and an SiNx film (upper layer), the thickness of the $SIO_2$ film is preferably no less than 50 nm and no more than 150 nm, and the thickness of the SiNx film is preferably no less than 50 nm and no more than 200 nm.

Next, the passivation film 15 is patterned by photolithography. As a result, in the storage capacitor-forming region B, an opening 17b exposing the drain electrode 13ad is formed through the passivation film 15. The opening 17b is formed above the storage capacitor Cs. Moreover, in the terminal portion-forming region C, an opening 17c exposing the connecting portion 13c is formed through the passivation film 15. As shown in the figure, the opening 11c and the opening 17c may have substantially equal widths; however, as viewed from the normal direction of the surface of the substrate 1, the opening 17c is preferably one size smaller than the opening 11c and located within the opening 11c. As a result, the openings 11c and 17c are disposed so as to appear as overlying one another when viewed from the normal direction of the substrate, such that a contact hole in a terminal portion can be constituted by the openings 11c and 17c.

Next, as shown in FIG. 1(f), a transparent conductive film is formed on the passivation film 15 and in the openings 17b and 17c, and the transparent conductive film is patterned. As a result, a pixel electrode 19 which is in contact with the exposed surface of the drain electrode 13ad, and a connecting portion 19c which is in contact with the exposed surface of the connecting portion 13c, are formed. Each pixel electrode 19 is to be disposed separately for the respective pixel.

In the present embodiment, the transparent conductive film is deposited by a sputtering technique, for example. As the transparent conductive film, an ITO film (thickness: 50 to 200 nm) is used, for example. Then, the ITO film is patterned by a known photolithography.

Although FIG. 1 illustrates one pixel electrode 19, one storage capacitor Cs, and one thin film transistor TFT for simplicity, the TFT substrate usually has a plurality of pixel portions 101, such that a pixel electrode 19, a storage capacitor Cs, and a thin film transistor TFT are disposed for each of the plurality of pixel portions 101. Moreover, in the terminal deployment region 102, there are formed as many terminal portions as there are source lines 13as and gate lines 3a.

Although not shown, there may be cases where a gate-source connecting portion for connecting the source line with the gate line is formed in the terminal deployment region 102. In such cases, when forming the opening 11c in the terminal portion, it is preferable that the insulating film 9 and the insulating film 5 above the gate line are simultaneously etched to form an opening exposing the gate line (or the connecting portion thereof). By forming the source line in this opening, a gate-source connecting portion is obtained where the source line and the gate line are in direct contact.

Figure 2:
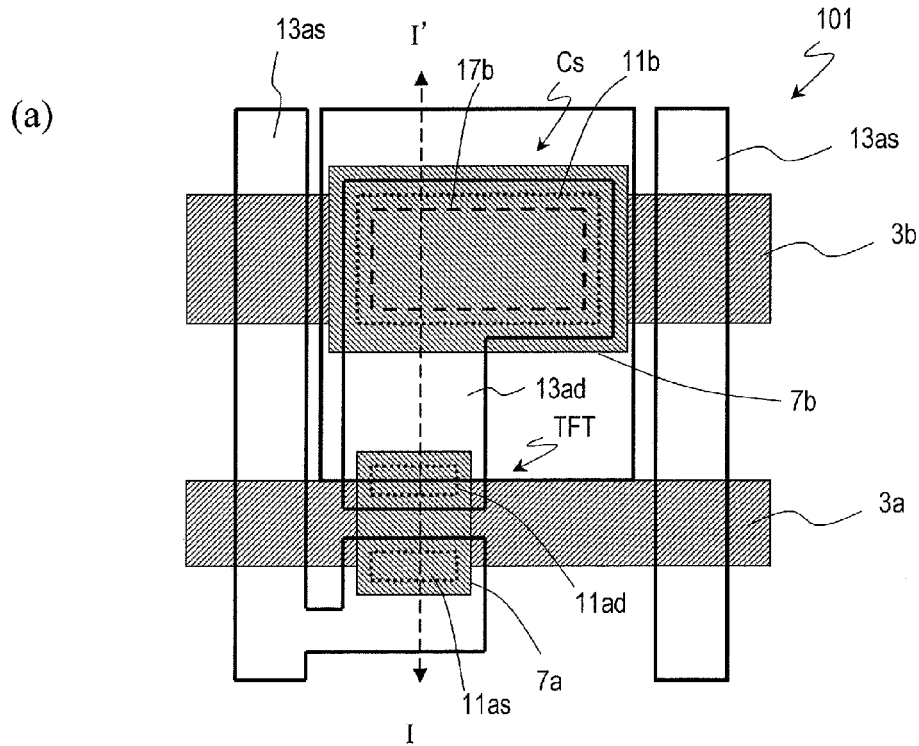
FIG. 2 Plan views of the semiconductor device according to Embodiment 1 of the present invention, where (a) is a plan view of a pixel portion 101 of the semiconductor device; and (b) to (d) are plan views of a gate terminal, a source terminal, and a gate-source connecting portion of the semiconductor device, respectively.
Figure 2:
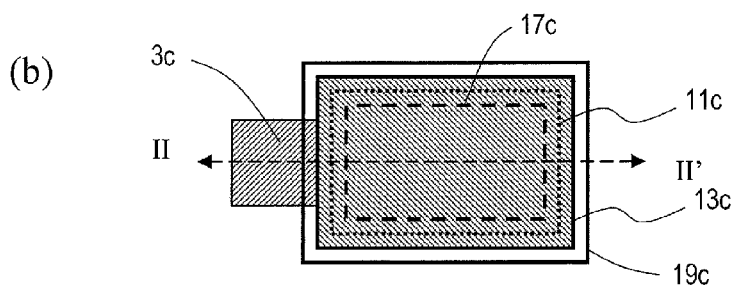
Figure 2:
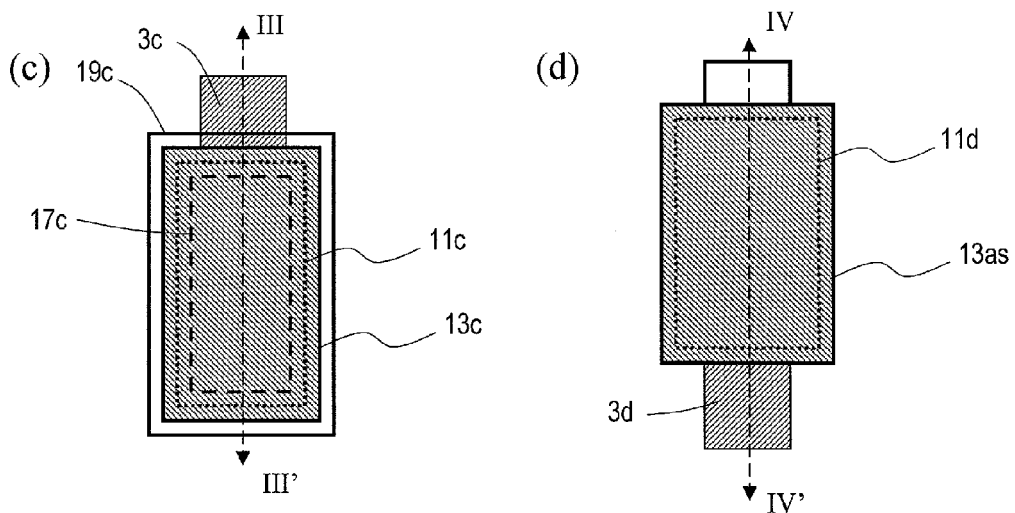
Figure 3:
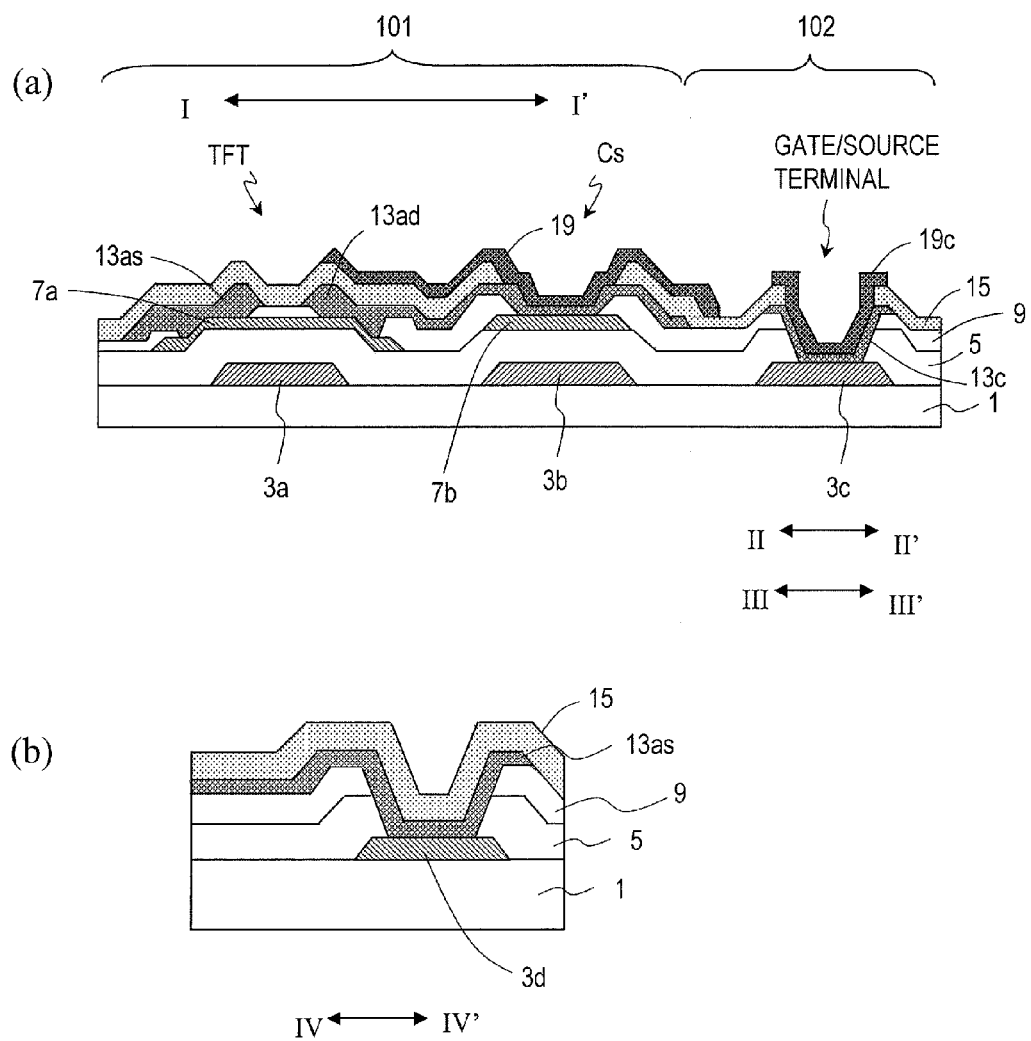
FIG. 3 (a) is a cross-sectional view along line I-I' shown in FIG. 2(a) and along line II-II' shown in FIG. 2(b) or line shown in FIG. 2(c). (b) is a cross-sectional view along line IV-IV' shown in FIG. 2(d).

FIG. 2 and FIG. 3 are diagrams schematically showing the semiconductor device of the present embodiment. FIG. 2(a) is a plan view of a pixel portion 101 of the semiconductor device, whereas FIGS. 2(b) to (d) are plan views of a gate terminal, a source terminal, and a gate-source connecting portion in the terminal deployment region 102 of the semiconductor device, respectively. FIG. 3(a) is a cross-sectional view along line I-I' shown in FIG. 2(a) and along line II-II' shown in FIG. 2(b) or line III-III' shown in FIG. 2(c). FIG. 3(b) is a cross-sectional view along line IV-IV' shown in FIG. 2(d).

As can be seen from these figures, in each pixel portion 101, a source line 13as extending along the row direction of pixels, and a gate line 3a and a storage capacitor line 3b extending along the column direction of pixels, are formed.

In the neighborhood of a point where the source line 13as and the gate line 3a intersect, a thin film transistor TFT is formed, and a storage capacitor Cs is formed above the storage capacitor line 3b.

The oxide semiconductor layer 7a of the TFT is connected to the source line 13as and the drain electrode 13ad, respectively via the openings 11as and 11ad of the insulating film 9. Moreover, the drain electrode 13ad extends to above the storage capacitor line 3b, and is connected to the pixel electrode 19 within the opening 17b of the passivation film 15, above the storage capacitor Cs.

The oxide semiconductor layer 7b of the storage capacitor Cs is connected to a storage capacitor electrode (which herein is the drain electrode 13ad) within the opening 11b of the insulating film 9, and connected to the pixel electrode 19 within the opening 17b of the passivation film 15. As viewed from the normal direction of the surface of the substrate 1, the opening 17b is located within the opening 11b.

In a gate terminal portion and a source terminal portion, the connecting portion 3c is connected to the connecting portion 13c within the opening 11c, which is obtained by simultaneously etching the insulating film 5 and the insulating film 9, and connected to the connecting portion 19c within the opening 17c of the passivation film 15. In the present embodiment, since the opening 17c is formed in the passivation film 15 after the connecting portion 3c is formed within the opening 11c, the connecting portion 3c covers end faces of the insulating films 5 and 9 in the opening 11c (the wall surface of the opening 11c), but does not cover an end face of the passivation film 15 in the opening 17c (the wall surface of the opening 17c). As viewed from the normal direction of the surface of the substrate 1, the opening 17c is located within the opening 11c.

In a gate-source connecting portion, a connecting portion 3d of the gate line is directly connected to the source line 13as within an opening 11d, which is obtained by simultaneously etching the insulating film 5 and the insulating film 9. The source line 13as is covered by the passivation film 15 from above.

The semiconductor device of the present embodiment, which is produced by the method described above with reference to FIG. 1, provides the following advantages as compared to conventional ones.

In the conventional method disclosed in Patent Document 1, only the channel protection film is etched first, and after forming the source/drain electrodes, the passivation film is etched. Therefore, the contact hole to be formed in a terminal portion is formed by etching the gate insulating film and the passivation film at one time in the etching of the passivation film (GI/Pass simultaneous etching). However, with this method, as described earlier, the etching time is very long in the case where the gate insulating film and the passivation film are formed by using $SiO_2$, and the surface of a resist film which is used as an etching mask may be so damaged that the resist film may not be removed well from the substrate.

Alternatively, in the method disclosed in Patent Document 2, a passivation film having a multilayer structure with an upper layer of organic insulating film and a lower layer of inorganic insulating film is formed, and the inorganic insulating film and the gate insulating film are etched by using the organic insulating film as a mask, whereby a contact hole of a terminal portion is formed (GI/Pass simultaneous etching). With this method, too, the etching time is very long in the case where the inorganic insulating film and the passivation film are formed by using $SiO_2$. Therefore, during the etching, the surface of the organic insulating film used as a mask may be damaged.

On the other hand, in the present embodiment, a contact hole of a terminal portion is formed in two separate steps. Specifically, etching for the insulating film 5 to become a gate insulating film and for the insulating film 9 for forming a channel protection film (etchstop) is simultaneously conducted, thus forming the opening 11c (GI/ES simultaneous etching). Subsequently, after the source/drain electrodes are formed, separately from the aforementioned GI/ES simultaneous etching, the passivation film 15 is etched to form the opening 17c in the passivation film 15 (Pass etching). Generally speaking, the thickness of the passivation film 15 is greater than the thickness of the insulating film 9 for forming a channel protection film. Therefore, in the GI/ES simultaneous etching of the present embodiment, as compared to the conventional GI/Pass simultaneous etching where the gate insulating film and the passivation film are simultaneously etched, the total thickness of the films to be etched (etched films) can be reduced. As a result, the etching time is greatly shortened, whereby damage on the etching mask can be reduced.

Moreover, with conventional methods, it may be difficult to control the taper shape of a contact hole. In conventional methods, the taper shape of a contact hole of a terminal portion is controlled based on the etching conditions in GI/Pass simultaneous etching. On the other hand, according to the present embodiment, control is based on the etching conditions in the etching of mainly the passivation film 15 alone (Pass etching). Generally speaking, given the same material of etched film, less consideration needs to be paid to the damage incurred by an etching mask (resist film), which means selection of etching conditions is facilitated, as the etched film is thinner. Therefore, according to the present embodiment, where the etched film can be made thinner than in the conventional methods, it is possible to control the taper shape of the wall surface of the contact hole with a higher precision.

In particular, in the case where the gate insulating film and the passivation film both have a multilayer structure (e.g., a two-layer structure), four layers of film will have to be etched in the conventional methods, which makes it very difficult to control the taper shape. In the present embodiment, even in such cases, the taper shape can be controlled through etching of the two layers of film that compose the passivation film, thereby greatly enhancing the taper shape controllability.

Thus, according to the present embodiment, it is ensured with greater certainty that the wall surface of a contact hole be inclined against the substrate normal at a predetermined angle (taper angle), whereby disruption of any line formed above the contact hole can be prevented. Therefore, electrical connection between a source line or gate line in a terminal portion and an input section of a driving circuit is ensured.

Figure 4:
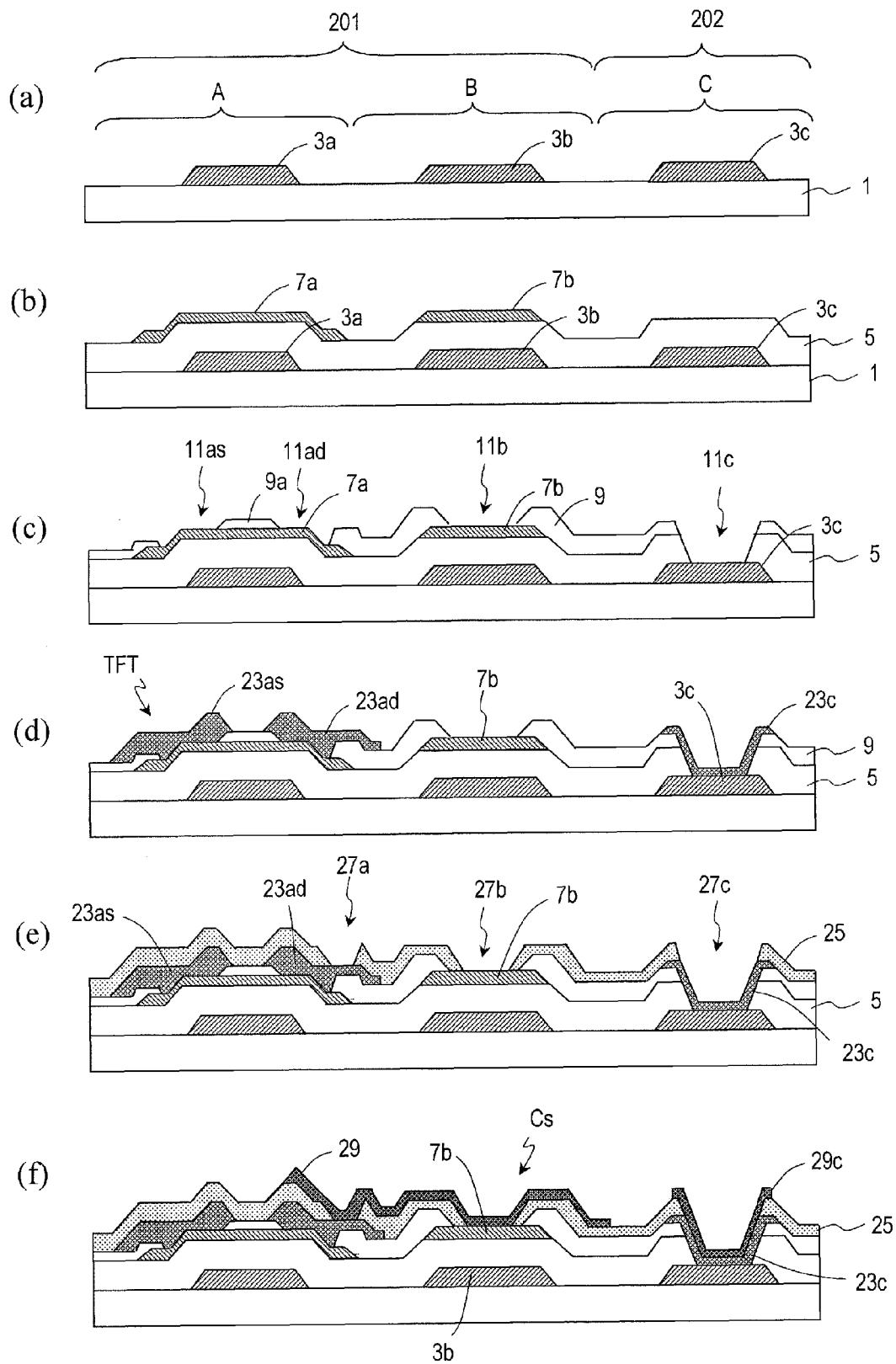
FIG. 4 (a) to (f) are step-by-step cross-sectional views showing an exemplary method for producing a semiconductor device according to Embodiment 2 of the present invention.

Furthermore, conventionally in a gate-source connecting portion, a gate line and a source line are electrically connected via a transparent conductive film for forming the pixel electrodes (e.g., FIG. 4 of Patent Document 2). This has resulted in a problem in that, if the wall surface of a contact hole of a gate-source connecting portion is not sufficiently inclined against the substrate normal, the source line composing the wall surface and the transparent conductive film formed on the wall surface cannot be electrically connected.

On the other hand, according to the present embodiment, the insulating film (gate insulating film) 5 and the insulating film 9 are simultaneously etched, and thus a gate-source connecting portion such that a connecting portion 3d of a gate line and a source line 13as are in direct contact can be formed. Therefore, even if the wall surface of the contact hole is almost uninclined, regardless of the taper shape of the wall surface of the contact hole, the gate line 3a and the source line 13as can be electrically connected with greater certainty.

Furthermore, the present embodiment also provides the following advantage over the construction disclosed in Patent Document 3.

In the construction disclosed in Patent Document 3, a gate electrode, a gate insulating film, and an oxide semiconductor layer are patterned by using the same mask. The side walls of these layers are covered by an insulating film which functions as an etchstop. In this construction, only the insulating film functioning as an etchstop is provided between the side wall of the gate electrode and the source electrode, thus resulting in a possibility of short-circuiting between these electrodes. On the other hand, according to the present embodiment, the insulating film 5 to become a gate insulating film, the oxide semiconductor layer 7a, and the insulating film 9 functioning as an etchstop are longer than is the gate line 3a along the channel length direction, and thus the side wall of gate line 3a is covered by the insulating film 5, the oxide semiconductor layer 7a, and the insulating film 9. Therefore, at least two layers of insulating film (i.e., the insulating film 5 and the insulating film 9) exist between the upper face and side wall of the gate line 3a and the source line 13as, and between the upper face and side wall of the gate line 3a and the drain electrode 13ad. As a result, the aforementioned short-circuiting can be prevented. Moreover, even in cases where the insulating film 5 is holed, especially in the portion of the insulating film 5 that is located between the gate line 3a and the source/drain electrode 13as, 13ad, the insulating film 9 can cover over this, thus preventing a point defect from occurring between them.

In the present embodiment, it is preferable that at least one of the insulating film 5, the insulating film 9, and the passivation film 15 contains $SiO_2$. As a result of this, oxygen will be supplied from any such film to the oxide semiconductor layer 7a to become an active layer of the TFT, whereby oxygen defects occurring in the oxide semiconductor layer 7a can be further reduced. As a result, the oxide semiconductor layer 7a can be restrained from having a low resistance due to oxygen defects, whereby leak currents and hysteresis can be alleviated. Particularly, it will be more effective if the surface of any such insulating film that is on the oxide semiconductor layer 7a side (i.e., the upper face of the insulating film 5, the lower face of the insulating film 9, and the lower face of the passivation film 15) is made of $SiO_2$.

Moreover, it is preferable that the insulating film 9, including the channel protection film 9a, covers the entire upper face (except for the source/drain regions) and the entire side wall of the island-shaped oxide semiconductor layer 7a. With such a construction, in the patterning step for forming the source/drain electrodes shown in FIG. 1(d), occurrence of oxygen defects in the channel region of the oxide semiconductor layer 7a and its neighborhood due to oxidation-reduction reactions can be suppressed. As a result, the oxide semiconductor layer 7a can be refrained from having a low resistance due to oxygen defects, whereby leak currents and hysteresis can be alleviated. Moreover, it is preferable that the insulating film 9 is longer than the oxide semiconductor layer 7a along the channel width direction, and is in contact also with the upper face of the insulating film 5 located in the neighborhood of the side wall of the oxide semiconductor layer 7a. As a result of this, with greater certainty, the insulating film 9 will protect not only the upper face but also the side wall of the oxide semiconductor layer 7a.

The oxide semiconductor layer 7a, 7b of the present embodiment is preferably a layer of a Zn—O type semiconductor (ZnO), an In—Ga—Zn—O type semiconductor (IGZO), an In—Zn—O type semiconductor (IZO), or a Zn—Ti—O type semiconductor (ZTO), for example.

Embodiment 2

Hereinafter, with reference to the drawings, a method for producing a semiconductor device according to Embodiment 2 of the present invention will be described. The present embodiment differs from Embodiment 1 in that a pixel electrode is used as a storage capacitor electrode, instead of a drain electrode.

FIGS. 4(a) to (f) are schematic step-by-step cross-sectional views for describing a method for producing the semiconductor device of the present embodiment. For simplicity, constituent elements similar to those in FIG. 1 will be denoted by like reference numerals, and the description thereof will be omitted.

First, as shown in FIG. 4(a), a gate line 3a is formed in a TFT-forming region A of a substrate 1 where a TFT is to be formed; a storage capacitor line 3b is formed in a storage capacitor-forming region B where a storage capacitor is to be formed; and a connecting portion 3c of a gate line is formed in a terminal portion-forming region C where a gate/source terminal is to be formed. The formation methods and materials of the lines 3a and 3b and the connecting portion 3c are similar to the methods and materials described above with reference to FIG. 1(a).

Next, as shown in FIG. 4(b), an insulating film 5 is formed so as to cover the gate line 3a, the storage capacitor line 3b, and the connecting portion 3c. Then, an island-shaped oxide semiconductor layer 7a to become a channel layer of the TFT is formed in the TFT-forming region A, and an island-shaped oxide semiconductor layer 7b is formed in the storage capacitor-forming region B. The formation methods and materials of the insulating film 5 and the oxide semiconductor layer 7a, 7b are similar to the methods and materials described above with reference to FIG. 1(b).

Next, as shown in FIG. 4(c), an insulating film 9 is deposited over the entire surface of the substrate 1, and thereafter the insulating film 9 is patterned. As a result, in the TFT-forming region A, portions of the insulating film 9 where a source contact and a drain contact are to be formed are etched, whereby two openings 11as and 11ad exposing the oxide semiconductor layer 7a are formed. The insulating film 9 covers the region of the oxide semiconductor layer 7a to become a channel, and functions as a channel protection film 9a. In the storage capacitor-forming region B, the portion of the insulating film 9 that is located above the oxide semiconductor layer 7b is etched away, whereby an opening 11b exposing the oxide semiconductor layer 7b is formed. In the terminal portion-forming region C, the portion of the insulating film 9 that is located above the connecting portion 3c and the underlying insulating film 5 are consecutively etched away, whereby an opening 11c exposing the surface of the connecting portion 3c is obtained. The formation method, material, and etching method of the insulating film 9 are similar to the methods and materials described above with reference to FIG. 1(c).

Next, as shown in FIG. 4(d), after a conductive film is deposited over the entire surface of the substrate 1, this is patterned. As a result, in the TFT-forming region A, on the inside of the openings 11as and 11ad and on the insulating film 9, a source line 23as and a drain electrode 23ad are formed so as to be respectively in contact with regions located at opposite sides of the region of the oxide semiconductor layer 7a to become a channel region. The drain electrode 23ad in the present embodiment has an island-shaped pattern covering a portion of the oxide semiconductor layer 7a, and does not extend to the storage capacitor-forming region B, unlike in Embodiment 1. In the terminal portion-forming region C, on the inside of the opening 11c and on the insulating film 9, a connecting portion 23c which is in contact with the connecting portion 3c is formed. In the present embodiment, through this etching step, a portion of the conductive film that is located on the surface of the oxide semiconductor layer 7b in the storage capacitor-forming region B (i.e., inside the opening 11b) is also removed. In this manner, an oxide semiconductor TFT is formed in the TFT-forming region A. The material and formation method of the conductive film are similar to the material and method described above with reference to FIG. 1(d).

Thereafter, as shown in FIG. 4(e), a passivation film 25 is deposited over the entire surface of the substrate 1. Next, the passivation film 25 is patterned through photolithography, wet etching, and resist removal/cleaning steps. As a result, in the TFT-forming region A, an opening 27a exposing the surface of the drain electrode 23ad is formed on the passivation film 25. Moreover, in the storage capacitor-forming region B, an opening 27b exposing the surface of the oxide semiconductor layer 7b is formed. Furthermore, in the terminal portion-forming region C, an opening 27c exposing the connecting portion 23c is formed. The material, formation method, and etching method of the passivation film 25 are similar to the material and method described above with reference to FIG. 1(e).

Thereafter, as shown in FIG. 4(f), a transparent conductive film (e.g., an ITO film) is formed on the passivation film 25 and inside the openings 27a, 27b, and 27c, and the transparent conductive film is patterned. As a result, a pixel electrode 29 which is in contact with the exposed surface of the drain electrode 23ad and the oxide semiconductor layer 7b, and a connecting portion 29c which is in contact with the exposed surface of the connecting portion 23c, are formed.

In the present embodiment, a storage capacitor Cs is formed in the storage capacitor-forming region B through this step. The storage capacitor Cs is constituted by the storage capacitor line 3b and the oxide semiconductor layer 7b and pixel electrode 29 as electrodes, and the insulating film 5 as dielectric.

Figure 5:
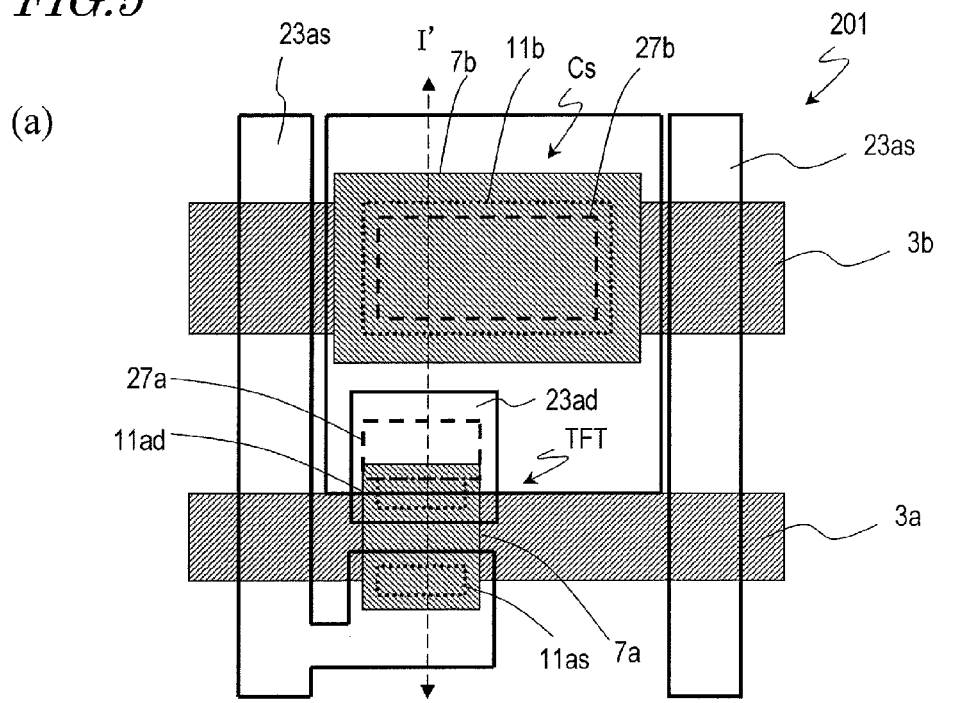
FIG. 5 Plan view of the semiconductor device according to Embodiment 2 of the present invention, where (a) is a plan view of a pixel portion 201 of the semiconductor device, and (b) to (d) are plan views of a gate terminal, a source terminal, and a gate-source connecting portion of the semiconductor device, respectively.
Figure 5:
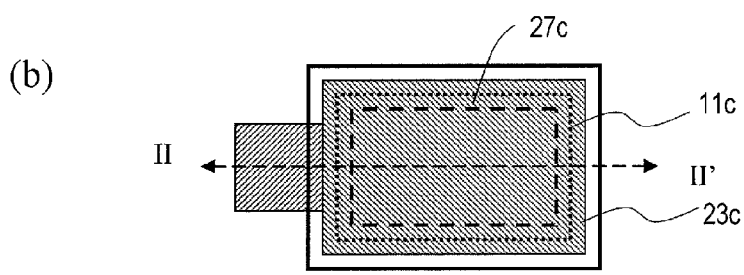
Figure 5:
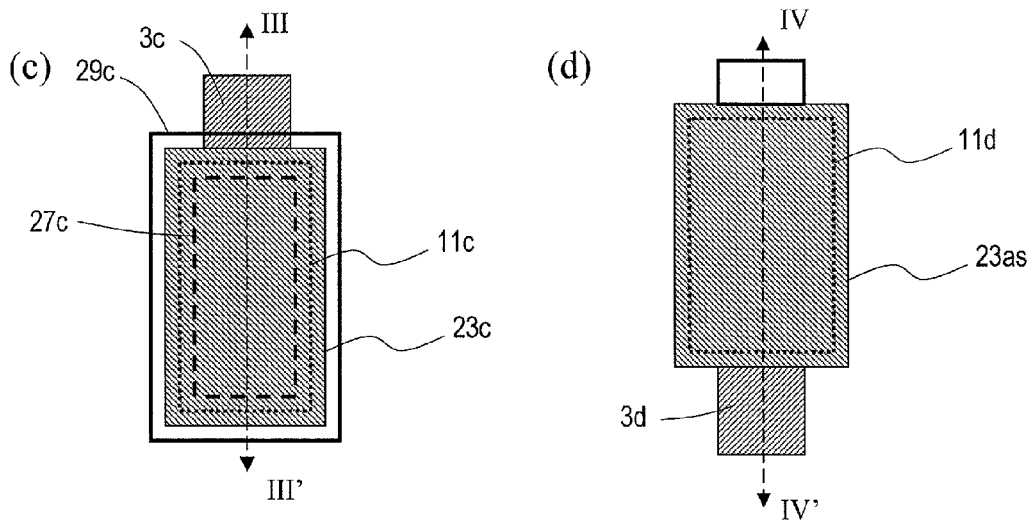
Figure 6:
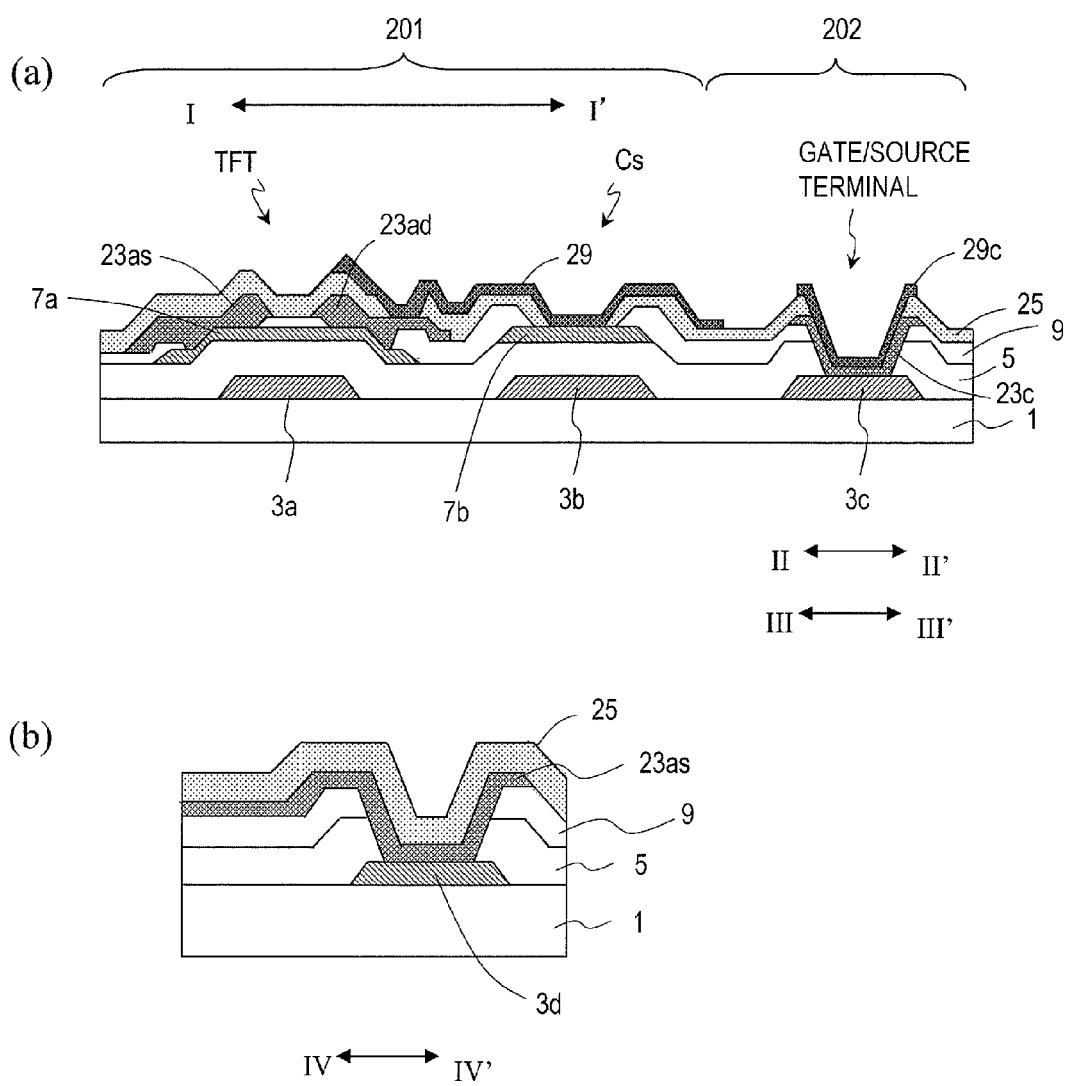
FIG. 6 (a) is a cross-sectional view along line I-I' shown in FIG. 5(a) and along line II-II' shown in FIG. 5(b) or line shown in FIG. 5(c). (b) is a cross-sectional view along line IV-IV' shown in FIG. 5(d).

FIG. 5 and FIG. 6 are diagrams schematically showing the semiconductor device of the present embodiment. FIG. 5(a) is a plan view of a pixel portion 201 of the semiconductor device, whereas FIGS. 5(b) to (d) are plan views of a gate terminal, a source terminal, and a gate-source connecting portion in a terminal deployment region 202 of the semiconductor device, respectively. FIG. 6(a) is a cross-sectional view along line I-I' shown in FIG. 5(a) and along line II-II' shown in FIG. 5(b) or line shown in FIG. 5(c). FIG. 6(b) is a cross-sectional view along line IV-IV' shown in FIG. 5(d).

As can be seen from these figures, in each pixel portion 201, a source line 23as extending along the row direction of pixels, and a gate line 3a and a storage capacitor line 3b extending along the column direction of pixels, are formed. In the neighborhood of a point where the source line 23as and the gate line 3a intersect, a thin film transistor TFT is formed. The oxide semiconductor layer 7a of the TFT is connected to the source line 23as and the drain electrode 23ad, respectively within the openings 11as and 11ad of the insulating film 9. The drain electrode 23ad is electrically connected to the pixel electrode 29 within the opening 27a of the passivation film 25.

On the storage capacitor line 3b, a storage capacitor Cs is formed. The oxide semiconductor layer 7b of the storage capacitor Cs is connected to the pixel electrode 29 in a contact hole which is composed of the opening 11b of the insulating film 9 and the opening 27b of the passivation film 25. Therefore, the pixel electrode 29 also functions as a storage capacitor electrode. As viewed from the normal direction of the surface of the substrate 1, the opening 27b is located within the opening 11b.

In a gate terminal portion and a source terminal portion, the connecting portion 3c is connected to the connecting portion 23c in the opening 11c, which is obtained by simultaneously etching the insulating film 5 and the insulating film 9. The connecting portion 23c is connected to the connecting portion 29c in the opening 27c of the passivation film 25. In the present embodiment, as in Embodiment 1, the opening 27c is formed in the passivation film 25 after the connecting portion 23c is formed in the opening 11c, so that the connecting portion 23c covers end faces of the insulating films 5 and 9 in the opening 11c (the wall surface of the opening 11c), but does not cover an end face of the passivation film 25 in the opening 27c (the wall surface of the opening 27c). As viewed from the normal direction of the surface of the substrate 1, the opening 27c is located within the opening 11c.

In the present embodiment, too, a gate-source connecting portion may be formed in the terminal deployment region 202 of the substrate 1. In the gate-source connecting portion, the connecting portion 3d of a gate line is directly connected to the source line 23as within the opening 11c, which is obtained by simultaneously etching the insulating film 5 and the insulating film 9. The source line 23as is covered by the passivation film 25.

According to the present embodiment, a contact hole of a terminal portion is formed through etching of the insulating film 5 to become the gate insulating film and the insulating film 9 for forming a channel protection film (etchstop) (GI/ES simultaneous etching), and etching of the passivation film 25 (Pass etching). Therefore, the etching time can be greatly shortened as compared to conventional methods where the gate insulating film and the passivation film are simultaneously etched. Therefore, similarly to Embodiment 1, damage on the etching mask can be reduced. Moreover, the taper shape of the wall surface of the contact hole can be controlled with a higher precision. Furthermore, in a gate-source connecting portion, the connecting portion 3d of the gate line and the source line 23as can be directly connected, so that the connecting portion 3d of the gate line and the source line 23as can be electrically connected with greater certainty, regardless of the taper shape of the wall surface of the contact hole of the gate-source connecting portion.

Moreover, the present embodiment provides the following advantages, unlike Embodiment 1. In Embodiment 1, the island-shaped pattern of the drain electrode extends to the storage capacitor Cs, so as to be utilized as a storage capacitor electrode. On the other hand, in the present embodiment, the drain electrode is not formed on the storage capacitor Cs. This structure is realized because the oxide semiconductor layer 7b in the storage capacitor-forming region B functions as an etchstop in the conductive film patterning step for forming the source line 23as, the drain electrode 23ad, and the connecting portion 23c (FIG. 4(d)).

Usually, when the drain electrode is used as a storage capacitor electrode as in the case of Embodiment 1, a margin needs to be provided to ensure that the drain electrode and the storage capacitor line overlap. Therefore, a design is adopted such that at least one of the storage capacitor line and the drain electrode has a large planar shape. For example, Embodiment 1 adopts a design such that the width of the storage capacitor line is exceeded by the width of an overlying drain electrode. The drain electrode and the storage capacitor electrode are each made of a metal film or the like, and any increase in their planar shape will be a cause for a lowered aperture ratio.

Also in the present embodiment, a margin needs to be provided to ensure that the storage capacitor line 3b overlap with the oxide semiconductor layer 7b and pixel electrode 29. For this reason, the oxide semiconductor layer 7b and the pixel electrode 29 are designed so as to have a greater width than the width of the storage capacitor line 3b. However, the oxide semiconductor layer 7b and the pixel electrode 29 are both transparent, and therefore will not be a cause for a lowered aperture ratio even if they are in enlarged patterns. Thus, the aperture ratio can be increased over Embodiment 1.

Embodiment 3

Hereinafter, with reference to the drawings, a method for producing a semiconductor device according to Embodiment 3 of the present invention will be described. The present embodiment differs from the above-described embodiments in that an organic insulating film is formed between a passivation film and a pixel electrode.

FIGS. 7(a) to (c) are schematic step-by-step cross-sectional views for describing a method for producing the semiconductor device of the present embodiment. For simplicity, constituent elements similar to those in FIG. 4 will be denoted by like reference numerals, and the descriptions thereof will be omitted.

First, as shown in FIG. 7(a), by a method similar to Embodiment 2 (FIGS. 4(a) to (d)), a gate line 3a, a storage capacitor line 3b, a connecting portion 3c, an insulating film 5, an oxide semiconductor layer 7a, 7b, an insulating film 9, a source line 23as, a drain electrode 23ad, and a connecting portion 23c are formed on a substrate 1.

Next, as shown in FIG. 7(b), on the surface of the substrate 1, a passivation film 25 and an organic insulating film 36 are formed in this order. Herein, as the passivation film 25, for example, an oxide film having a thickness of 50 nm to 300 nm is formed by a CVD technique. The organic insulating film 36 is formed by applying an acrylic resin film to a thickness of no less than 1 μm and no more than 4 μm, for example. Preferably, the surface of the substrate 1 is planarized by the organic insulating film 36.

Next, after patterning the organic insulating film 36 by photolithography, the passivation film 25 is patterned by dry etching, using the organic insulating film 36 as a mask. As a result, in the TFT-forming region A, an opening 37a exposing the surface f the drain electrode 23ad is formed through the passivation film 25 and the organic insulating film 36. Moreover, in the storage capacitor-forming region B, an opening 37b exposing the surface of the oxide semiconductor layer 7b is formed. Furthermore, in the terminal portion-forming region C, an opening 37c exposing the connecting portion 23c is formed.

Thereafter, as shown in FIG. 7(c), a transparent conductive film (e.g., an ITO film) is formed on the passivation film 25 and in the openings 37a, 37b, and 37c, and the transparent conductive film is patterned. Thus, a pixel electrode 29 which is in contact with the exposed surface of the drain electrode 23ad and the oxide semiconductor layer 7b, and a connecting portion 29c which is in contact with the exposed surface of the connecting portion 23c, are formed. The pixel electrode 29 also functions as an electrode of a storage capacitor Cs. In this manner, the semiconductor device of the present embodiment is obtained.

A plan view of the semiconductor device of the present embodiment would be similar to the plan view of the semiconductor device of Embodiment 2 described above with reference to FIG. 5. However, the openings 27a, 27b, and 27c of the passivation film 25 shown in FIG. 5 should read as the openings 37a, 37b, and 37c of the passivation film 25 and the organic insulating film 36 in the present embodiment. Moreover, a cross-sectional view of a gate-source connecting portion in the present embodiment would be similar to the cross-sectional view of a gate-source connecting portion of Embodiment 2 shown in FIG. 6(b).

According to the present embodiment, a contact hole of a terminal portion is formed through etching of the insulating film 5 to become the gate insulating film and the insulating film 9 for forming a channel protection film (etchstop) (GI/ES simultaneous etching), and etching of the organic insulating film 36 and etching of the passivation film 25 (Pass etching). Therefore, the etching time can be greatly shortened as compared to conventional methods where the gate insulating film and the passivation film are simultaneously etched. Therefore, similarly to the above-described embodiments, damage on the etching mask can be reduced. Moreover, the taper shape of the wall surface of the contact hole can be controlled with a higher precision. Furthermore, in a gate-source connecting portion, the connecting portion 3d of the gate line and the source line 23as can be electrically connected with greater certainty. Moreover, as in Embodiment 2, a margin for ensuring overlap between the storage capacitor line 3b, the oxide semiconductor layer 7b, and the pixel electrode 29 can be provided without lowering the aperture ratio.

The present embodiment also provides an advantage in that, even if the connecting portion 23c is disrupted inside a contact hole of a terminal portion, electrical connection between the gate line 3c and the connecting portion 29c can be obtained with greater certainty.

Figure 8:
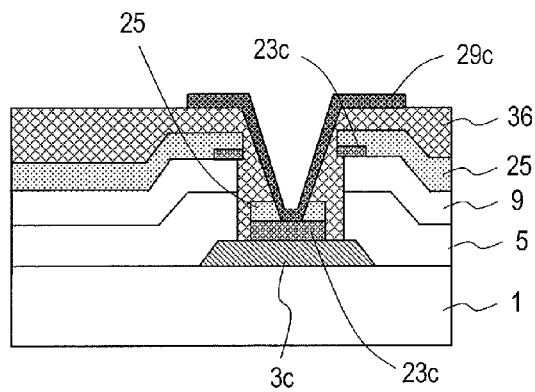
FIG. 8 An enlarged cross-sectional view illustrating a terminal portion in the case where a disruption has occurred in a connecting portion 23c in the semiconductor device of Embodiment 3.

FIG. 8 is an enlarged cross-sectional view illustrating a terminal portion in the case where a disruption has occurred in the connecting portion 23c. As shown in the figure, in the case where the wall surface of the opening 11c composed of the insulating film 5 and the insulating film 9 does not have a desired taper shape (e.g., the wall surface of the opening 11c being substantially perpendicular to the surface of the substrate 1), a disruption may occur in the connecting portion 23c formed inside the opening 11c. If the connecting portion 23c is disrupted, the passivation film 25 will be deposited only on the disrupted connecting portion 23c by a CVD technique or the like. On the other hand, since the organic insulating film 36 is to be applied so as to cover the wall surface of the opening 11c, any space occurring due to the disruption will be buried, whereby an opening 37c with a smoother wall surface is obtained. As a result of this, the connecting portion 29c deposited in the opening 37c is unlikely to be disrupted. Consequently, as shown in the figure, even if a disruption occurs in the connecting portion 23c, the connecting portion 29c and the gate line 3c can be electrically connected via the connecting portion 23c.

It is considered that, even when an organic insulating film is provided on a passivation film as in the method disclosed in Patent Document 1, the advantage which has been described with reference to FIG. 8 will not be obtained if the inorganic insulating film and the gate insulating film are simultaneously etched (Pass/GI simultaneous etching). As mentioned earlier, in an oxide semiconductor TFT, $SiO_2$ films are preferably used as the gate insulating film, the channel protection film, and the passivation film. The reason is that, since an $SiO_2$ film has a lower etch rate than do SiNx films, it makes it difficult to control the surface state or taper shape of an organic insulating film which is an etching mask during Pass/GI simultaneous etching.

Figure 9:
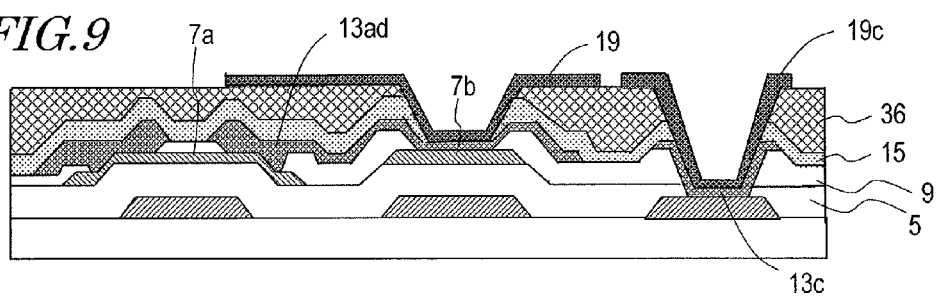
FIG. 9 A cross-sectional view illustrating the construction of another semiconductor device according to Embodiment 3 of the present invention.
Figure 10:
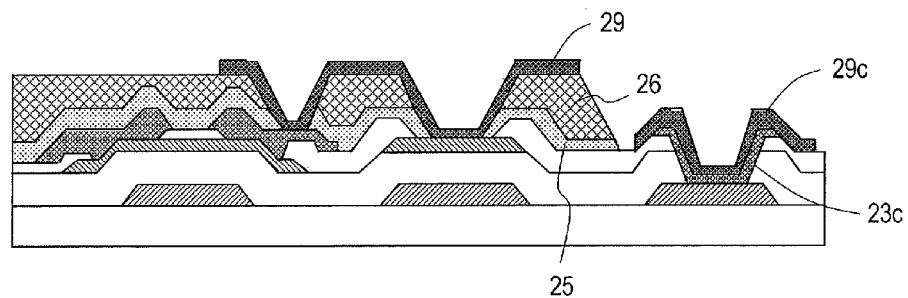
FIG. 10 A cross-sectional view illustrating the construction of still another semiconductor device according to Embodiment 3 of the present invention.

The construction of the semiconductor device of the present embodiment is not limited to the construction described above with reference to FIG. 7. FIG. 9 and FIG. 10 are cross-sectional views showing other examples of the semiconductor device of the present embodiment.

Figure 7:
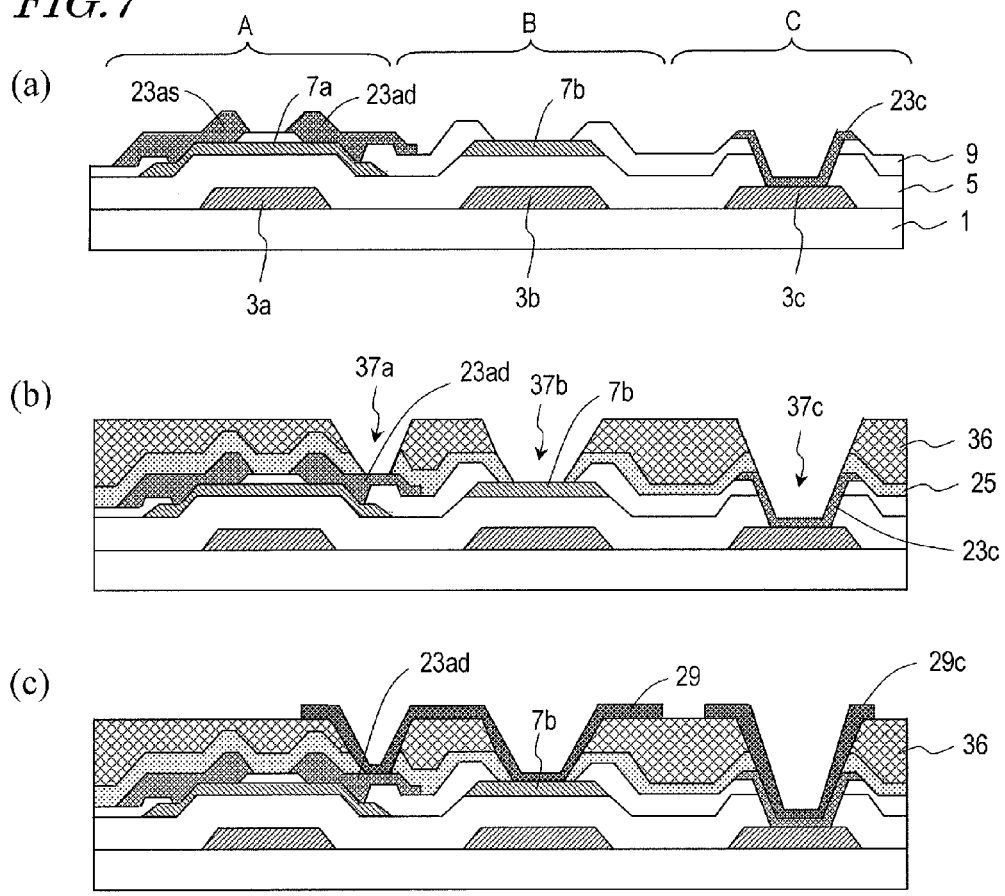
FIG. 7 (a) to (c) are step-by-step cross-sectional views showing an exemplary method for producing a semiconductor device according to Embodiment 3 of the present invention.

In the example shown in FIG. 7, the organic insulating film 36 is formed on the passivation film 25. As shown in FIG. 9, however, the organic insulating film 36 may be formed on the passivation film 15 of the semiconductor device of Embodiment 1 instead. A plan view of the semiconductor device shown in FIG. 9 would be similar to the plan view of the semiconductor device of Embodiment 1 shown in FIG. 2. However, the openings 17b and 17c of the passivation film 15 shown in FIG. 2 should read as the openings of the passivation film 15 and the organic insulating film 36 in the present embodiment. Moreover, a cross-sectional view of a gate-source connecting portion would be similar to the cross-sectional view of a gate-source connecting portion of Embodiment 1 shown in FIG. 3(b). The semiconductor device shown in FIG. 9 provides similar effects to those of Embodiment 1. Moreover, as has been described above with reference to FIG. 8, even if a disruption occurs in the connecting portion 13c, electrical connection between lines in a terminal portion can be ensured.

In the example shown in FIG. 7, the passivation film 25 and the organic insulating film 36 are formed in the terminal portion-forming region C as well. However, as shown in FIG. 10, the passivation film 25 and the organic insulating film 36 do not need to be formed in the terminal portion-forming region C. Furthermore, also in the case where the organic insulating film 36 is formed on the passivation film 15 as shown in FIG. 9, the passivation film and the organic insulating film 36 do not need to be formed in the terminal portion-forming region C.

Embodiment 4

Hereinafter, with reference to the drawings, a method for producing semiconductor device according to Embodiment 4 of the present invention will be described. The present embodiment differs from the above-described embodiments in that a multilayer film having a lower layer of SiNx film and an upper layer of $SiO_2$ film is formed as a gate insulating film, and that a multilayer film having a lower layer of $SiO_2$ film and an upper layer of SiNx film is formed as a passivation film.

FIGS. 11(a) to (c) are schematic step-by-step cross-sectional views for describing a method for producing the semiconductor device of the present embodiment. For simplicity, constituent elements similar to those in FIG. 4 will be denoted by like reference numerals, and the descriptions thereof will be omitted.

First, as shown in FIG. 11(a), a gate line 3a, a storage capacitor line 3b, and a connecting portion 3c are formed on the substrate 1. The method of forming the gate line 3a, the storage capacitor line 3b, and the connecting portion 3c is similar to the method described above with reference to FIG. 1(a).

Next, as shown in FIG. 11(b), an SiNx film 5L and an $SiO_2$ film 5U are formed in this order so as to cover the gate line 3a, the storage capacitor line 3b, and the connecting portion 3c, thus obtaining an insulating film 5. Thereafter, an oxide semiconductor layer 7a, 7b is formed on the insulating film 5.

Herein, by a CVD technique, an SiNx film 5L having a thickness of e.g. no less than 200 nm and no more than 500 nm and an $SiO_2$ film 5U having a thickness of e.g. no less than 20 nm and no more than 150 nm are formed. The oxide semiconductor layer 7a, 7b is obtained by forming an IGZO film having a thickness of e.g. no less than 30 nm and no more than 300 nm by a sputtering technique, and patterning it. The method of forming the oxide semiconductor layer 7a, 7b is similar to the method above described with reference to FIG. 1(b).

Next, although not shown, an insulating film 9 is deposited on the surface of the substrate 1 with the method described above with reference to FIG. 1(c). Thereafter, in the TFT-forming region A, an opening for forming a source contact and an opening for forming a drain contact are formed in the insulating film 9; and in the storage capacitor-forming region B, an opening exposing the oxide semiconductor layer 7b is formed in the insulating film 9. At the same time, in the terminal portion-forming region C, the insulating film 9 and the insulating film 5 are etched to form an opening. Next, with the method described above with reference to FIG. 4(d), a metal film is formed on the insulating film 9 and in the opening of the insulating film 9, and this is patterned to form a source line 23as, a drain electrode 23ad, and a connecting portion 23c.

Thereafter, as shown in FIG. 11(c), an $SiO_2$ film 25L and an SiNx film 25U are formed in this order on the surface of the substrate 1, thereby forming a passivation film 25. In the present embodiment, a CVD technique is used herein to form an $SiO_2$ film 25L having a thickness of e.g. no less than 50 nm and no more than 150 nm and an SiNx film 25U having a thickness of e.g. no less than 50 nm and no more than 200 nm.

Next, through photolithography, wet etching, and resist removal/cleaning steps, the passivation film 25 is patterned. As a result, in the TFT-forming region A, an opening 27a exposing the surface of the drain electrode 23ad is formed in the passivation film 25. Moreover, in the storage capacitor-forming region B, an opening 27b exposing the surface of the oxide semiconductor layer 7b is formed. Furthermore, in the terminal portion-forming region C, an opening 27c exposing the connecting portion 23c is formed.

Thereafter, although not shown, as has been described above with reference to FIG. 4(f), a transparent conductive film (e.g., an ITO film) is formed on the passivation film 25 and in the openings 27a, 27b, and 27c, and the transparent conductive film is patterned. As a result, a pixel electrode 29 which is in contact with the exposed surface of the drain electrode 23ad and the oxide semiconductor layer 7b, and a connecting portion 29c which is in contact with the exposed surface of the connecting portion 23c, are formed.

A plan view of the semiconductor device of the present embodiment is similar to the plan view of the semiconductor device of Embodiment 2 described above with reference to FIG. 5. Moreover, a cross-sectional view of a gate-source connecting portion in the present embodiment would be similar to the cross-sectional view of the gate-source connecting portion of Embodiment 2 shown in FIG. 6(b).

According to the present embodiment, effects similar to those of Embodiment 2 are obtained. Moreover, use of multilayer films composed of an $SiO_2$ film and an SiNx film as the insulating film (gate insulating film) 5 and the passivation film 25 provides the following advantage.

In an oxide semiconductor TFT, when a single layer of SiNx film is used as the gate insulating film and the passivation film, there is a possibility that oxygen in the oxide semiconductor layer may be reduced because a heat treatment is conducted while the oxide semiconductor layer is in contact with the SiNx during the production process. Moreover, the oxide semiconductor layer is susceptible to plasma damage when the SiNx film is formed. As a result, the characteristics of the oxide semiconductor TFT may be deteriorated. On the other hand, when a single layer of $SiO_2$ film is used as the gate insulating film and the passivation film, the aforementioned problems are avoided, but the $SiO_2$ film needs to be made thick in order to achieve a source-gate breakdown voltage, because an $SiO_2$ film has a lower dielectric constant than does an SiNx film. This may decrease the ON current of the TFT.

On the other hand, when multilayer films composed of an $SiO_2$ film and an SiNx film are used as the gate insulating film and the passivation film, even if they are thinner than a gate insulating film or a passivation film composed only of an $SiO_2$ film, a sufficient breakdown voltage can be achieved. Therefore, decrease in the ON current of the TFT associated with the gate insulating film and the passivation film can be suppressed. Furthermore, within each multilayer film, by disposing the $SiO_2$ film as the film that is in contact with the oxide semiconductor layer or that comes closest to the oxide semiconductor layer, it is possible to prevent oxygen in the oxide semiconductor layer from being reduced by SiNx, and prevent plasma damage of the oxide semiconductor layer when forming the SiNx film.

The insulating film 5 of the present embodiment may have any multilayer structure including an $SiO_2$ film and an SiNx film such that the uppermost layer of the multilayer structure, i.e., the layer which is in contact with the lower face of the oxide semiconductor layer, is an $SiO_2$ film. Similarly, the passivation film 25 may have any multilayer structure including an $SiO_2$ film and an SiNx film such that the lowermost layer of the multilayer structure, i.e., the layer located closest to the oxide semiconductor layer side, is an $SiO_2$ film. Although both of the insulating film 5 and the passivation film 25 have a multilayer structure in the example shown in FIG. 11, the above effect can be obtained so long as only one of these has the aforementioned multilayer structure. However, a more outstanding effect will be obtained when both films 5 and 25 have the aforementioned multilayer structure.

In conventional methods, etching of the passivation film and the gate insulating film occurs simultaneously (Pass/GI simultaneous etching). Therefore, if these films were multilayer films as mentioned above, films of $SiNx/SiO_2/SiO_2/SiNx$ would be etched at one time. In other words, three layers ($SiNx/SiO_2/SiNx$) of mutually different dry etch rates would be etched at one time. This makes the taper control during etching very difficult. Since the SiNx film has a few times higher dry etch rate than does the $SiO_2$ film, etching these multilayer films may cause a shift in the SiNx film, thus resulting in an umbrella shape. Moreover, if an organic insulating film were provided on the passivation film as in Patent Document 1, damage on the surface of the organic insulating film serving as an etching mask would also need to be controlled, which makes taper control during the Pass/GI simultaneous etching almost impossible.

On the other hand, according to the present embodiment, etching is conducted for only two layers of $SiO_2/SiNx$ during the ES/GI simultaneous etching, and of $SiNx/SiO_2$ for the passivation film (Pass etching), so that taper control can be achieved with a higher precision than in the conventional method of etching the three layers of $SiNx/SiO_2/SiNx$.

Note that, as has been described in Embodiment 3, an organic insulating film may be provided between the passivation film 25 and the pixel electrode 29 also in the semiconductor device of the present embodiment. In this case, too, separately from the simultaneous etching of the insulating films 5 and 9, etching of the passivation film ($SiNx/SiO_2$) 25 may be performed by using the organic insulating film as an etching mask (Pass etching). As a result, the taper shape of any opening in the passivation film 25 can be controlled while suppressing damage on the surface of the organic insulating film.

Figure 11:
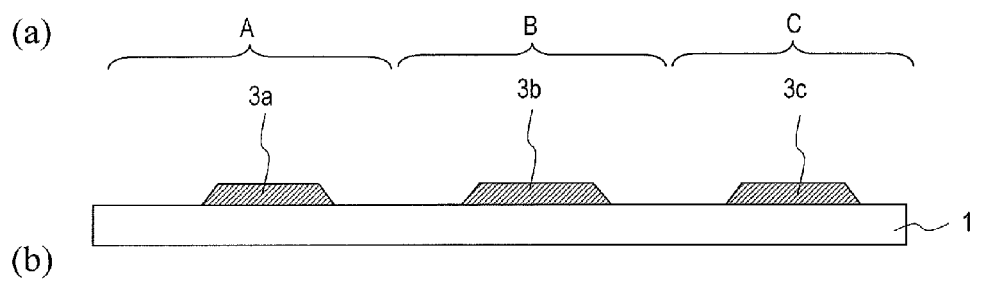
FIG. 11 (a) to (c) are step-by-step cross-sectional views showing an exemplary method for producing a semiconductor device according to Embodiment 4 of the present invention.
Figure 11:
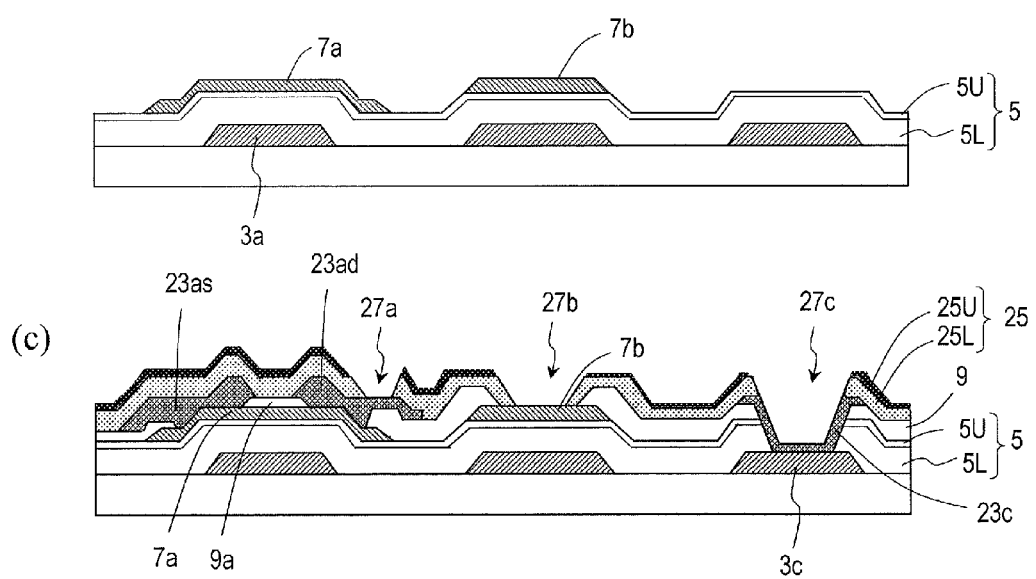
Figure 12:
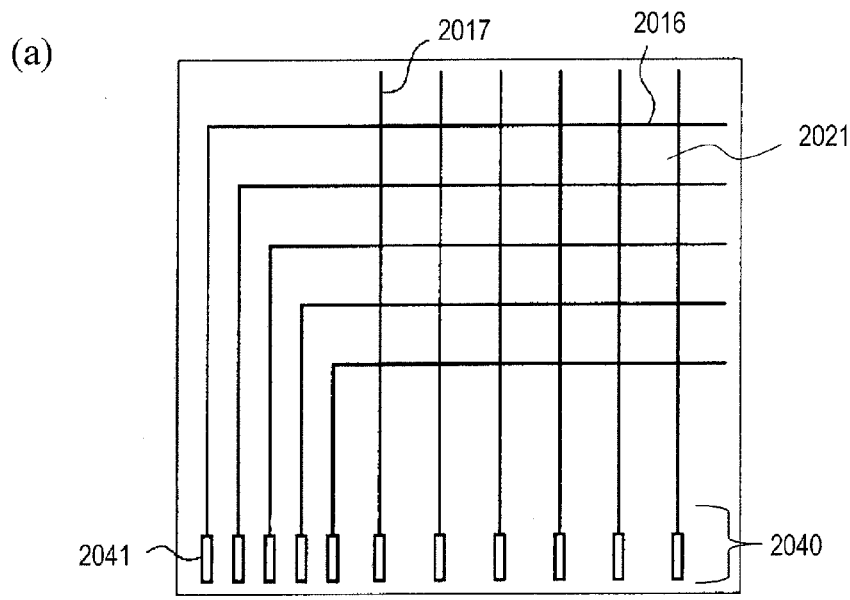
FIG. 12 (a) is a schematic plan view showing a conventional TFT substrate in outline, and (b) is an enlarged plan view showing one pixel in the TFT substrate of (a).
Figure 12:
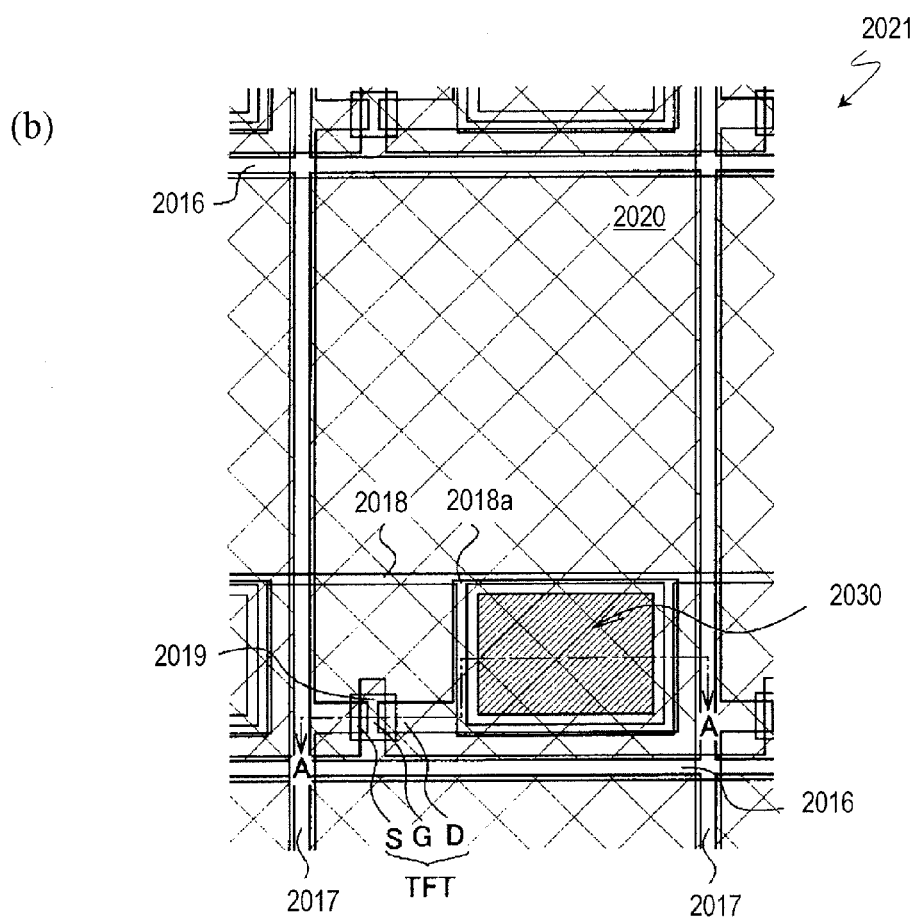
Figure 13:
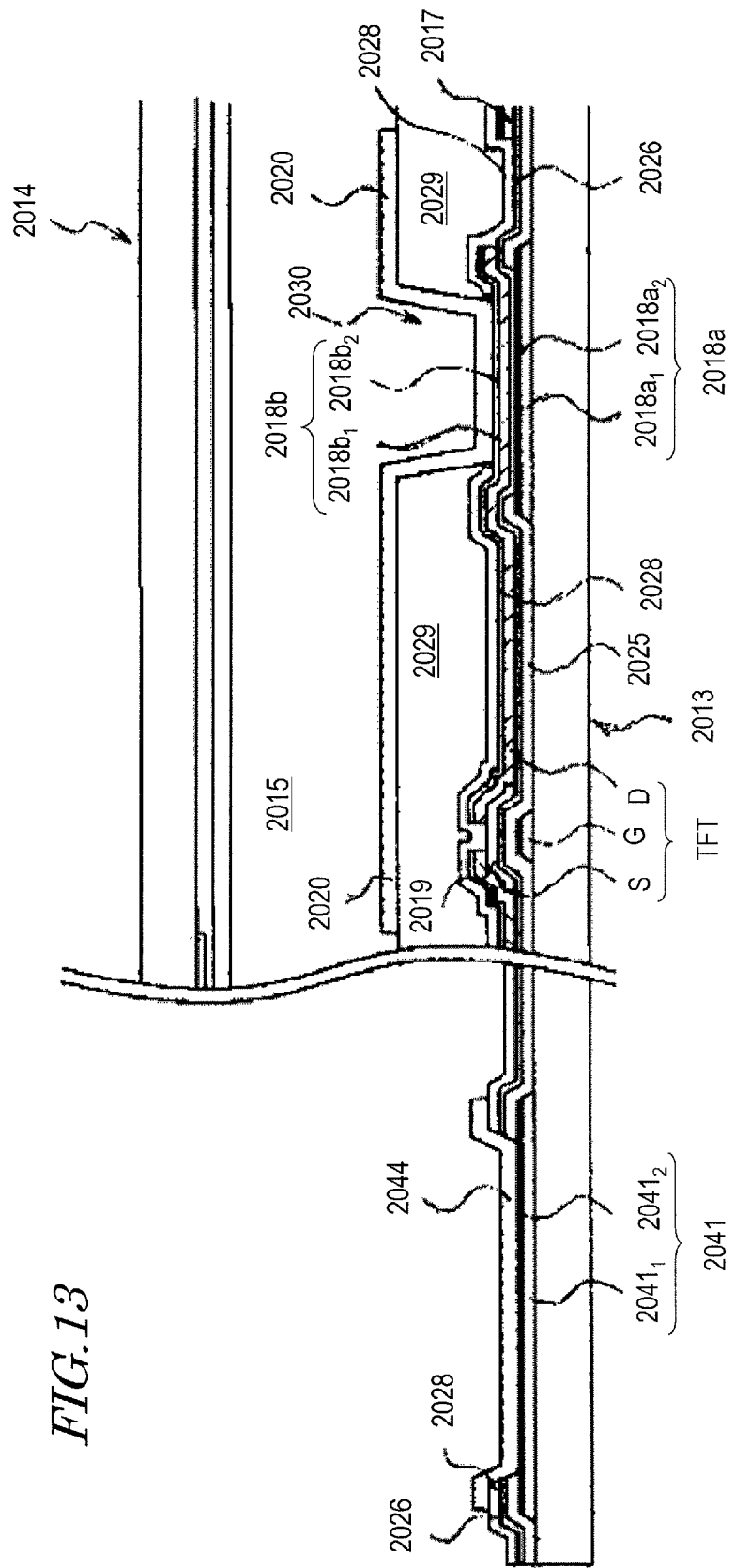
FIG. 13 A cross-sectional view of a TFT and terminal portions of the conventional TFT substrate shown in FIG. 12.
Figure 14:
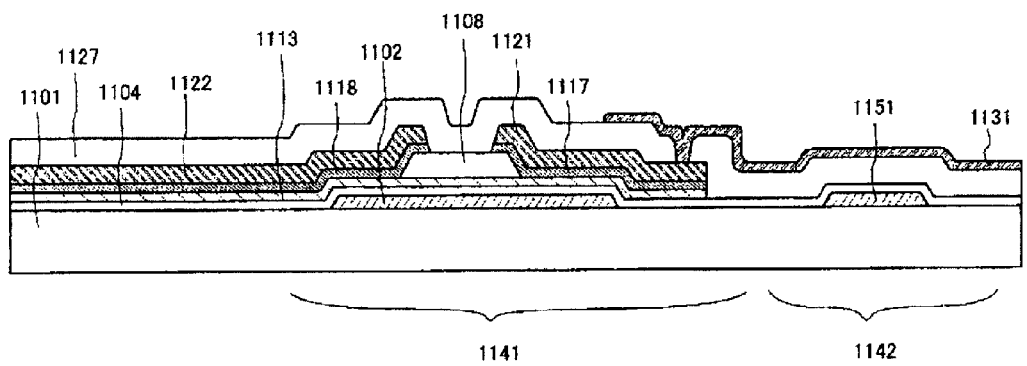
FIG. 14 A cross-sectional view showing a portion of a conventional TFT substrate.

In the example shown in FIG. 11, multilayer films composed of an SiNx film and an $SiO_2$ film are used as the insulating film 5 and the passivation film 25 of the semiconductor device of Embodiment 2. However, multilayer films composed of SiO$_2$ and SiNx may be used as the insulating film 5 and the passivation film 15 of the semiconductor device of Embodiment 1. As a result, effects similar to the above are obtained. In other words, without degrading taper shape controllability, deterioration of TFT characteristics can be suppressed. In this case, too, an organic insulating film such as that described in Embodiment 3 may be provided between the passivation film 15 and the pixel electrode 19.

INDUSTRIAL APPLICABILITY

The present invention is broadly applicable to devices having thin film transistors, such as: circuit boards, e.g., active matrix substrates; display devices, e.g., liquid crystal display devices, organic electroluminescence (EL) display devices, and inorganic electroluminescence display devices; imaging devices, e.g., image sensor devices; and electronic devices, e.g., image input devices and fingerprint reading devices. In particular, it is suitably applicable to large-sized liquid crystal display devices and the like.

REFERENCE SIGNS LIST 1 substrate
3a gate line
3b storage capacitor line
3c connecting portion
3d connecting portion
5 insulating film (gate insulating film)
5L lower layer of gate insulating film
5U upper layer of gate insulating film
7a, 7b oxide semiconductor layer (active layer)
9 insulating film (protection film, etch stopper)
11as, 11ad, 11b, 11c, 11d, 17b, 17c, 27a, 27b, 27c, 37a, 37b, 37c opening
13as, 23as source line
13ad, 23ad drain electrode
13c, 23c, 19c, 29c connecting portion
15, 25 passivation film
19, 29 pixel electrode
36 organic insulating film
25L lower layer of passivation film
25U upper layer of passivation film
101, 201 one pixel portion in displaying region
102, 202 terminal deployment region

The invention claimed is:

1. A method for producing a semiconductor device, the semiconductor device comprising:
a substrate; a thin film transistor formed on the substrate; and a terminal portion for electrically connecting the thin film transistor to external wiring;
the thin film transistor including:
a gate line provided on the substrate;
a first insulating film formed on the gate line;
an island-shaped oxide semiconductor layer formed on the first insulating film, the island-shaped oxide semiconductor layer having a channel region and having a source region and a drain region located at opposite sides of the channel region;
a second insulating film provided in contact with the oxide semiconductor layer;
a source line provided on the second insulating film and electrically connected to the source region;
a drain electrode provided on the second insulating film and electrically connected to the drain region; and
a passivation film being provided on the source line and the drain electrode and covering the thin film transistor; and
the terminal portion including:
a first connecting portion made of a same conductive film as the gate line;
a second connecting portion formed on the first connecting portion and made of a same conductive film as the source line and the drain electrode; and
a third connecting portion formed on the second connecting portion; wherein
within a first opening provided in the first insulating film and the second insulating film, the second connecting portion is in contact with the first connecting portion;
within a second opening provided in the passivation film, the third connecting portion is in contact with the second connecting portion; and
the second connecting portion covers end faces of the first insulating film and the second insulating film within the first opening, but does not cover an end face of the passivation film within the second opening, and a part of the second connecting portion is located between the second insulating film and the passivation film,
the method comprising:
(A) a step of forming a conductive film for a gate line on a substrate, and patterning the conductive film to form a gate line and a first connecting portion;
(B) a step of forming a first insulating film on the gate line and the first connecting portion;
(C) a step of forming on the first insulating film an oxide semiconductor layer to become an active layer of a thin film transistor;
(D) a step of forming a second insulating film covering the oxide semiconductor layer and the first insulating film;
(E) a step of etching the first and second insulating films to form in the second insulating film an opening for forming a source contact and an opening for forming a drain contact by using the oxide semiconductor layer as an etchstop, such that the oxide semiconductor layer is exposed through the openings, and form a first opening in the second insulating film and the first insulating film, such that a surface of the first connecting portion is exposed through the first opening;
(F) a step of forming a conductive film for source/drain electrodes on the second insulating film, and patterning the conductive film to form a source line which is in contact with the oxide semiconductor layer within the opening for forming a source contact, a drain electrode which is in contact with the oxide semiconductor layer within the opening for forming a drain contact, and a second connecting portion which is in contact with the first connecting portion within the first opening;
(G) a step of forming a passivation film on the source line, the drain electrode, and the second connecting portion;
(H) a step of forming a second opening in the passivation film, such that the second connecting portion is exposed through the second opening; and
(I) a step of forming a third connecting portion on the passivation film, the third connecting portion being in contact with the second connecting portion within the second opening.

2. The method for producing a semiconductor device of claim 1, wherein,
step (H) comprises a step of forming in the passivation film an opening for exposing the drain electrode; and
step (I) is a step of forming a transparent conductive film on the passivation film, and patterning the transparent conductive film to form the third connecting portion and a pixel electrode, the pixel electrode being in contact with the drain electrode within the opening for exposing the drain electrode.

3. The semiconductor device produced by the method of claim 1.

* * * * *